(12) United States Patent
Bessho

(10) Patent No.: US 12,721,048 B2
(45) Date of Patent: Aug. 25, 2026

(54) MRAM WITH ANNULAR SHIELD WINDING

(71) Applicant: SONY SEMICONDUCTOR SOLUTIONS CORPORATION, Kanagawa (JP)

(72) Inventor: Kazuhiro Bessho, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 212 days.

(21) Appl. No.: 18/551,713

(22) PCT Filed: Feb. 18, 2022

(86) PCT No.: PCT/JP2022/006598
§ 371 (c)(1),
(2) Date: Sep. 21, 2023

(87) PCT Pub. No.: WO2022/215367
PCT Pub. Date: Oct. 13, 2022

(65) Prior Publication Data
US 2024/0172566 A1 May 23, 2024

(30) Foreign Application Priority Data
Apr. 8, 2021 (JP) ................................ 2021-066014

(51) Int. Cl.
*H10N 50/80* (2023.01)
*G11C 11/16* (2006.01)
(Continued)

(52) U.S. Cl.
CPC .......... *H10N 50/80* (2023.02); *G11C 11/161* (2013.01); *G11C 11/1673* (2013.01);
(Continued)

(58) Field of Classification Search
CPC ........ H10N 50/80; H10N 50/01; H10N 50/10; G11C 11/161; G11C 11/1673;
(Continued)

(56) References Cited

U.S. PATENT DOCUMENTS

| | | | | |
|---|---|---|---|---|
| 9,023,688 B1 * | 5/2015 | Or-Bach | ................ | H10D 88/00 438/584 |
| 2013/0094279 A1 * | 4/2013 | Kobatake | ........... | G11C 13/0007 257/E45.001 |

(Continued)

FOREIGN PATENT DOCUMENTS

| | | |
|---|---|---|
| JP | 2013-089662 A | 5/2013 |
| JP | 2014-112691 A | 6/2014 |

(Continued)

OTHER PUBLICATIONS

International Search Report and Written Opinion of PCT Application No. PCT/JP2022/006598, issued on May 17, 2022, 09 pages of ISRWO.

*Primary Examiner* — Amir Zarabian
*Assistant Examiner* — Bradley S Coon
(74) *Attorney, Agent, or Firm* — CHIP LAW GROUP

(57) ABSTRACT

A storage device according to an aspect of the present disclosure includes an MTJ element, which is an example of a storage element including a storage layer having a changeable magnetization direction and an annular short-circuit winding provided for the MTJ element and the annular short-circuit winding has conductivity. The annular short-circuit winding is near the storage element.

19 Claims, 18 Drawing Sheets

(51) Int. Cl.
*H10B 61/00* (2023.01)
*H10N 50/01* (2023.01)
*H10N 50/10* (2023.01)

(52) U.S. Cl.
CPC .......... *G11C 11/1675* (2013.01); *H10B 61/00* (2023.02); *H10B 61/22* (2023.02); *H10N 50/01* (2023.02); *H10N 50/10* (2023.02)

(58) Field of Classification Search
CPC ..... G11C 11/1675; G11C 11/16; H10B 61/00; H10B 61/22; Y02D 10/00
See application file for complete search history.

(56) References Cited

U.S. PATENT DOCUMENTS

| | | | | |
|---|---|---|---|---|
| 2016/0188495 | A1* | 6/2016 | Naeimi | G11C 16/107<br>711/103 |
| 2017/0025601 | A1* | 1/2017 | Bhushan | H10B 61/22 |
| 2018/0240797 | A1* | 8/2018 | Yokoyama | H10D 88/00 |
| 2019/0096957 | A1* | 3/2019 | Uchida | H10N 50/85 |

FOREIGN PATENT DOCUMENTS

| | | | |
|---|---|---|---|
| JP | 2017-072375 | A | 4/2017 |
| JP | 2017-157662 | A | 9/2017 |
| WO | 2017/038403 | A1 | 3/2017 |

* cited by examiner

FIG.7

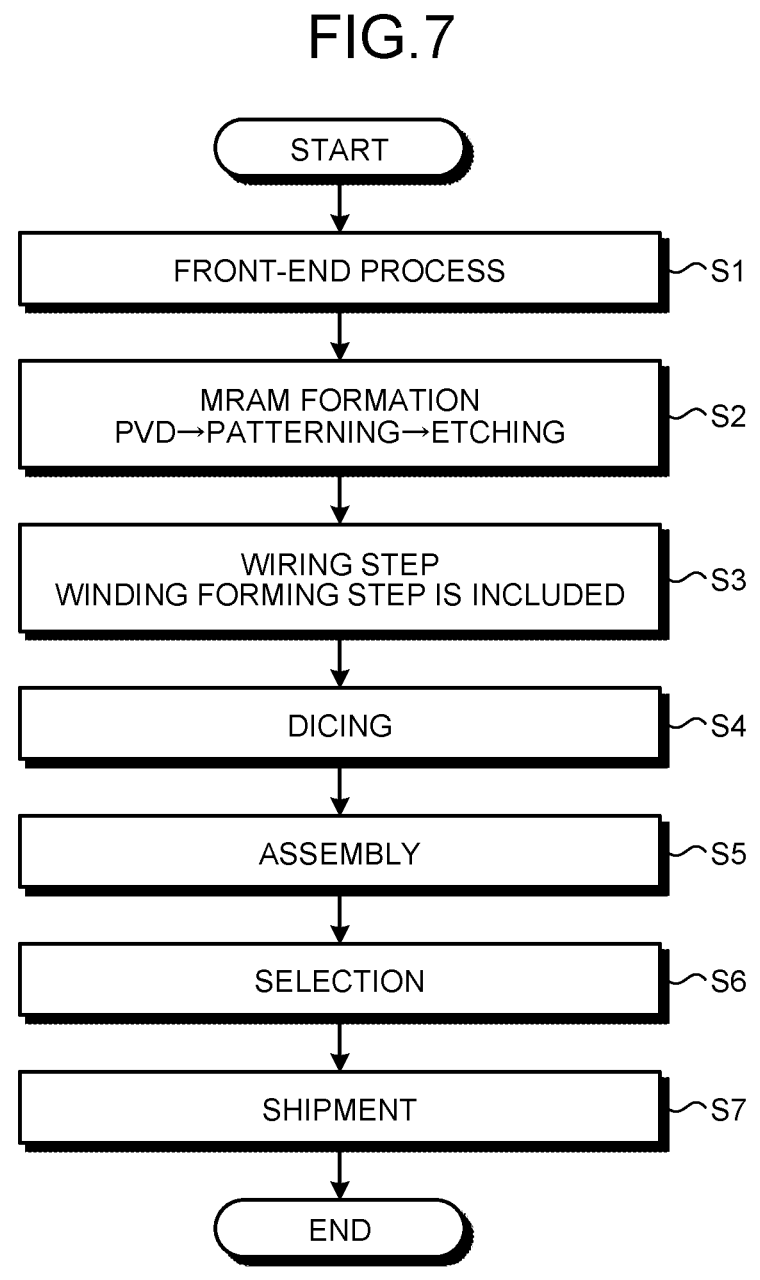

START

FRONT-END PROCESS ~S1

MRAM FORMATION
PVD→PATTERNING→ETCHING ~S2

WIRING STEP
WINDING FORMING STEP IS INCLUDED ~S3

DICING ~S4

ASSEMBLY ~S5

SELECTION ~S6

SHIPMENT ~S7

END

MRAM WITH ANNULAR SHIELD WINDING

CROSS REFERENCE TO RELATED APPLICATIONS

This application is a U.S. National Phase of International Patent Application No. PCT/JP2022/006598 filed on Feb. 18, 2022, which claims priority benefit of Japanese Patent Application No. JP 2021-066014 filed in the Japan Patent Office on Apr. 8, 2021. Each of the above-referenced applications is hereby incorporated herein by reference in its entirety.

FIELD

The present disclosure relates to a storage device, an electronic device, and a method of manufacturing the storage device.

BACKGROUND

Along with rapid development of various information devices from mobile terminals to large-capacity servers, further improvement in performance such as higher integration, higher speed, and lower power consumption has been pursued in elements such as memories and logics constituting the information devices. Particularly, the progress of a non-volatile semiconductor memory is remarkable, and for example, a flash memory as a large-capacity file memory is spreading at a speed of expelling a hard disk drive. On the other hand, in consideration of application to a code storage application and a working memory, in order to replace currently generally used an NOR flash memory, a dynamic random access memory (DRAM), and the like, a ferroelectric random access memory (FeRAM), a magnetic random access memory (MRAM), a phase-change random access memory (PCRAM), and the like are being developed. Some of them have already been put to practical use.

Among them, the MRAM can be rewritten at a non-volatile speed and $10^{10}$ or more times in order to store data according to the magnetization direction of a magnetic body, and has already been used in fields such as industrial automation and aircraft. The MRAM is expected to be developed in a code storage or a working memory in the future due to its high-speed operation and reliability. In the MRAM of a recording system using a current magnetic field, a current of mA order flows through a metal wiring provided for generating a magnetic field, and thus, there has been a problem of low power consumption and large capacity. However, as use of spin torque magnetization reversal in which a current flows through a storage element itself becomes mainstream, this problem is being solved.

The MRAM using the spin torque magnetization reversal is referred to as a spin torque transfer-magnetic random access memory (STT-MRAM). A storage element of the MRAM includes a magnetic tunnel junction (MTJ). This configuration uses application of torque (also referred to as spin transfer torque) to a magnetic layer when spin-polarized electrons passing through the magnetic layer fixed in a certain direction enter another free (non-fixed direction) magnetic layer, and the free magnetic layer is reversed when a current equal to or larger than a certain threshold value flows. Rewriting of 0/1 is performed by changing the polarity of a current. An absolute value of the current for this reversal is 100 microamperes or less for an element of a scale of about 50 nm. Moreover, since a current value decreases in proportion to an element volume, scaling is possible. A write operation has a trade-off with a write current, but can be about 100 ns or less. As a non-volatile memory capable of achieving high speed, high number of rewrites, low power consumption, and large capacity, the STT-MRAM has been greatly expected.

Reading of information in the STT-MRAM is performed as a difference in resistance value due to a magnetoresistance effect caused by a difference in relative angle between a magnetization free layer and a magnetization fixed layer. The resistance of the storage element is generally determined based on whether the resistance is higher or lower than a reference resistance for comparison, and a sense amplifier for performing this comparison determination is usually provided.

Information is stored not only in the STT-MRAM but also in the MRAM using the bistability of the magnetization free layer having uniaxial magnetic anisotropy similarly to a hard disk. For example, in the case of the MRAM having uniaxial anisotropy in a direction perpendicular to the laminated thin film surface (in this section, defined as a vertical direction assuming a cross-sectional view), whether the magnetization free layer is directed upwards or downwards is stable, and an intermediate angle thereof is unstable because of high energy. This is called bistability, and the height of an energy barrier that isolates both stable states is determined by material characteristics and size. For a device designed to be a sufficiently high energy barrier, stable digital storage can be performed by associating the upward and downward magnetization states with 0 and 1 (or vice versa), respectively.

CITATION LIST

Patent Literature

Patent Literature 1: JP 2014-112691 A
Patent Literature 2: JP 2013-89662 A
Patent Literature 3: WO 2017/38403 A

SUMMARY

Technical Problem

The stability of the information recorded in the MRAM is referred to as storage characteristics. The storage characteristics are represented by a low probability that the energy barrier is exceeded by external disturbance against the intention of a user and the state of 0 transitions to the state of 1 or the opposite state. This probability is referred to as a storage error rate.

A first external environmental factor is temperature. At high temperatures, thermal energy represented by the product of temperature and Boltzmann's constant increases, so that the effective energy barrier decreases, transition probability of the state increases, and stability deteriorates. A second factor is an external magnetic field. Since there is a difference in potential energy felt by magnetization depending on the direction of a magnetic field, the stability of either 0 or 1 deteriorates. That is, the influence is asymmetric with respect to data.

The external magnetic field also affects write characteristics. Writing of the STT-MRAM is merely a process of causing transition from the state of 0 to the state of 1 or vice versa beyond the energy barrier described above. Due to asymmetric influence of the external magnetic field, writing of either 0 or 1 becomes easy, while writing of the other becomes difficult. In other words, regarding data of either 0 or 1, the probability of failure in writing with respect to a program voltage, that is, a write error rate increases. As described above, the external magnetic field causes an increase in both the storage error and the write error.

On the other hand, an environment in which information processing equipment equipped with a memory is placed is also diversified, and, regarding the external magnetic field, there are various generation sources in both strength and frequency, such as a drive device such as a fixing magnet and a motor, and further, electromagnetic induction type contactless power supply. Therefore, it is necessary to sufficiently reduce the write error and the storage error even under these external magnetic fields, but there is a limit to enhancing the energy barrier by improving the characteristics of the materials forming the MRAM. Therefore, a method of shielding the MRAM from these magnetic fields by providing a magnetic shield structure has been proposed.

For example, a first method is a so-called static magnetic field shield in which a material such as permalloy having high magnetic permeability is provided in the vicinity of the MRAM (inside the chip or package) (for example, refer to Patent Literatures 1 and 2). Further, in a second method, a wiring shield layer made of a metal wiring is disposed in the vicinity of the MRAM to shield a high-frequency magnetic field (for example, refer to Patent Literature 3).

However, while the first method is extremely effective in shielding a static magnetic field, the effectiveness thereof is reduced in a region exceeding 100 kHz. In addition, manufacturing costs increase with the use of parts using special materials. In addition, the second method is effective in shielding a high-frequency magnetic field, but it is difficult to shield a magnetic field from a source located inside a shield as viewed from the MRAM, and arrangement is restricted. For these reasons, a method of reducing an error caused by an external magnetic field at low cost is desired.

Therefore, the present disclosure provides a storage device, an electronic device, and a method of manufacturing the storage device capable of reducing an error caused by an external magnetic field at low cost.

Solution to Problem

A storage device according to an aspect of the present disclosure includes: a storage element including a storage layer having a changeable magnetization direction; and an annular short-circuit winding provided for the storage element and configured to have conductivity.

An electronic device according to an aspect of the present disclosure includes: a storage device configured to store information, wherein the storage device includes: a storage element including a storage layer having a changeable magnetization direction; and an annular short-circuit winding provided for the storage element and configured to have conductivity.

A method of manufacturing a storage device according to an aspect of the present disclosure, the method includes: forming a storage element including a storage layer having a changeable magnetization direction; and forming an annular short-circuit winding for the storage element and configured to have conductivity.

BRIEF DESCRIPTION OF DRAWINGS

FIG. 7 is a flowchart illustrating an example of a manufacturing step of the storage device according to the first embodiment.

FIG. 11 is a cross-sectional view illustrating an example of an overall configuration of a storage device according to a fourth embodiment.

FIG. 14 is a cross-sectional view illustrating an example of an overall configuration of a storage device according to a seventh embodiment.

DESCRIPTION OF EMBODIMENTS

Figure 1:
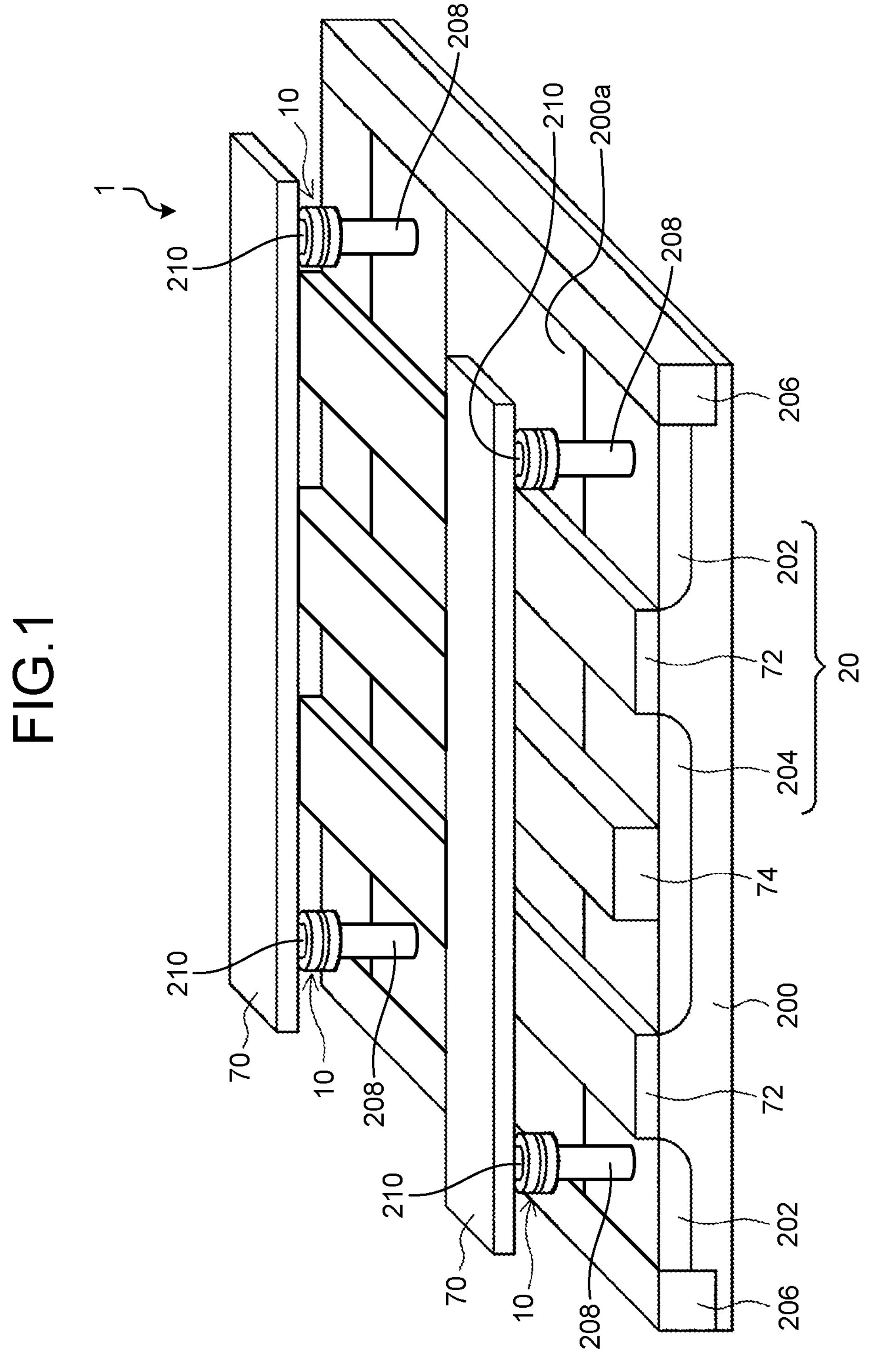
FIG. 1 is a perspective view illustrating an example of a schematic configuration of a storage device according to a first embodiment.

Hereinafter, embodiments of the present disclosure will be described in detail with reference to the drawings. It is noted that an apparatus, a device, and a method according to the present disclosure are not limited by the embodiments. In each of the following embodiments, basically the same parts are denoted by the same reference numerals, and redundant description is omitted.

One or more embodiments (including examples and modifications) described below can each be implemented independently. On the other hand, at least some of the plurality of embodiments described below may be appropriately combined with at least some of other embodiments to be implemented. The plurality of embodiments may include novel features different from each other. Therefore, the plurality of embodiments can contribute to solving different objects or problems, and can exhibit different effects. It is noted that the effects in each embodiment are merely examples and are not limited, and other effects may be obtained.

In addition, the drawings referred to in the following description are drawings for promoting the description and understanding of an embodiment of the present disclosure, and shapes, dimensions, ratios, and the like illustrated in the drawings may be different from actual ones for the sake of clarity. Furthermore, the elements and the like illustrated in the drawings can be appropriately modified in design in consideration of the following description and a known technique. In addition, in the following description, a vertical direction of a stacked structure of an element and the like corresponds to a relative direction in a case where the surface on a substrate on which the element is provided is directed upwards, and may be different from a vertical direction according to an actual gravitational acceleration.

In the following description, terms such as a "perpendicular direction" (a direction perpendicular to a film surface or a stacking direction of a stacked structure) and an "in-plane direction" (a direction parallel to the film surface or a direction perpendicular to the stacking direction of the stacked structure) are used for convenience when a magnetization direction (magnetic moment) and magnetic anisotropy are described. However, these terms do not necessarily mean the exact direction of magnetization. For example, descriptions such as "a magnetization direction is a perpendicular direction" or "having perpendicular magnetic anisotropy" mean that magnetization in the perpendicular direction is superior to magnetization in the in-plane direction. Similarly, for example, descriptions such as "a magnetization direction is an in-plane direction" and "having in-plane magnetic anisotropy" mean that magnetization in the in-plane direction is superior to magnetization in the perpendicular direction.

The present disclosure will be described according to the following order of items.

1. First Embodiment
1-1. Configuration example of storage device
1-2. Configuration example of storage element
1-3. Writing and reading of storage element
1-4. STT-MRAM of in-plane magnetization type and perpendicular magnetization type
1-5. Overall configuration example of storage device
1-6. Specific example of effects of short-circuit winding
1-7. Method of manufacturing storage device
1-8. Action and effects
2. Second Embodiment
2-1. Overall configuration example of storage device
2-2. Action and effects
3. Third Embodiment
3-1. Overall configuration example of storage device
3-2. Action and effects
4. Fourth Embodiment
4-1. Overall configuration example of storage device
4-2. Action and effects
5. Fifth Embodiment
5-1. Overall configuration example of storage device
5-2. Action and effects
6. Sixth Embodiment
6-1. Overall configuration example of storage device
6-2. Action and effects
7. Seventh Embodiment
7-1. Overall configuration example of storage device
7-2. Action and effects
8. Other Embodiments
9. Configuration example of electronic device
9-1. Imaging device
9-2. Game device
10. Appendix

1. FIRST EMBODIMENT

1-1. Configuration Example of Storage Device

A configuration example of a storage device (magnetic storage device) 1 according to a first embodiment will be described with reference to FIG. 1. FIG. 1 is a perspective view illustrating an example of a schematic configuration of the storage device 1 according to the first embodiment. The storage device 1 is a storage device that stores information by a magnetization direction of a magnetic body.

As illustrated in FIG. 1, the storage device 1 according to the first embodiment includes a plurality of MTJ elements 10. Each of the MTJ elements 10 is disposed in the vicinity of the intersection of two types of address wiring such as a bit line 70 and a gate electrode (word line) 72 intersecting (orthogonal to) each other, and is provided in a matrix shape. The MTJ element 10 has two terminals, one terminal is electrically connected to the bit line 70, and the other terminal is electrically connected to a selection transistor 20. The MTJ element 10 is an example of a storage element, and the matrix shape is an example of an array shape.

The selection transistor 20 is provided on a semiconductor substrate 200 such as a silicon substrate, and is formed in a region separated by an element separation layer 206 provided on the semiconductor substrate 200. The selection transistor 20 is a transistor for selecting the MTJ element 10. The selection transistor 20 includes the gate electrode (word line) 72, a source region 202, and a drain region 204.

In the storage device 1, a plurality of memory cells are arranged on the semiconductor substrate 200. In the example of FIG. 1, one memory cell includes the MTJ element 10 and one selection transistor 20 for selecting the MTJ element 10. Therefore, in FIG. 1, portions corresponding to the four memory cells are extracted and illustrated.

The gate electrode 72 is provided so as to extend in the depth direction in FIG. 1, and also serves as a word line. A wiring 74 is provided on the drain region 204, and the wiring 74 is electrically connected to the drain region 204. The drain region 204 is configured such that its potential can be appropriately changed via the wiring 74. In the example of FIG. 1, the drain region 204 is formed to be shared in the selection transistors 20 arranged adjacent to each other.

A contact layer 208 is provided on the source region 202, and the contact layer 208 is electrically connected to the source region 202. The MTJ element 10 is provided on the contact layer 208, and the MTJ element 10 is electrically connected to the contact layer 208. The contact layer 208 electrically connects the source region 202 of the selection transistor 20 to the MTJ element 10. The contact layer 208 is, for example, a contact via and is an example of a through wiring. The contact layer 208 functions as an upper electrode.

A contact layer 210 is provided on the MTJ element 10, and the contact layer 210 is electrically connected to the MTJ element 10. On the contact layer 210, the bit line 70 is provided so as to extend in a direction orthogonal to the gate electrode (word line) 72, and the bit line 70 is electrically connected to the contact layer 210. The contact layer 210 electrically connects the MTJ element 10 to the bit line 70.

The contact layer 210 is, for example, a contact via and is an example of a through wiring. The contact layer 210 functions as a lower electrode.

Such a storage device 1 is provided with a power supply circuit (not illustrated) capable of applying a desired current to the gate electrode (word line) 72 and the bit line 70. At the time of writing information, the power supply circuit applies a voltage to the address wiring corresponding to a desired memory cell to which the information is desired to be written, that is, the gate electrode (word line) 72 and the bit line 70, and causes a current to flow through the MTJ element 10. It is noted that the MTJ element 10 can write information of 1/0 by reversing the magnetic moment of a predetermined layer (a storage layer 106 to be described later) by spin torque magnetization reversal (to be described later in detail).

On the other hand, at the time of reading information, the storage device 1 applies a voltage to the gate electrode (word line) 72 corresponding to a desired memory cell from which the information is desired to be read by the power supply circuit, and detects a current flowing from the bit line 70 through the MTJ element 10 to the selection transistor 20. Since the electrical resistance of the MTJ element 10 changes depending on the direction of the magnetic moment in a predetermined layer (the storage layer 106 to be described later) of the MTJ element 10 due to a tunnel magnetoresistance (TMR) effect, information of 1/0 can be read based on the magnitude of a detected current value. At this time, since the current at the time of reading is much smaller than the current flowing at the time of writing, the magnetic direction in the predetermined layer of the MTJ element 10 does not change at the time of reading. That is, the MTJ element 10 can read information in a non-destructive manner.

1-2. Configuration Example of Storage Element

Figure 2:
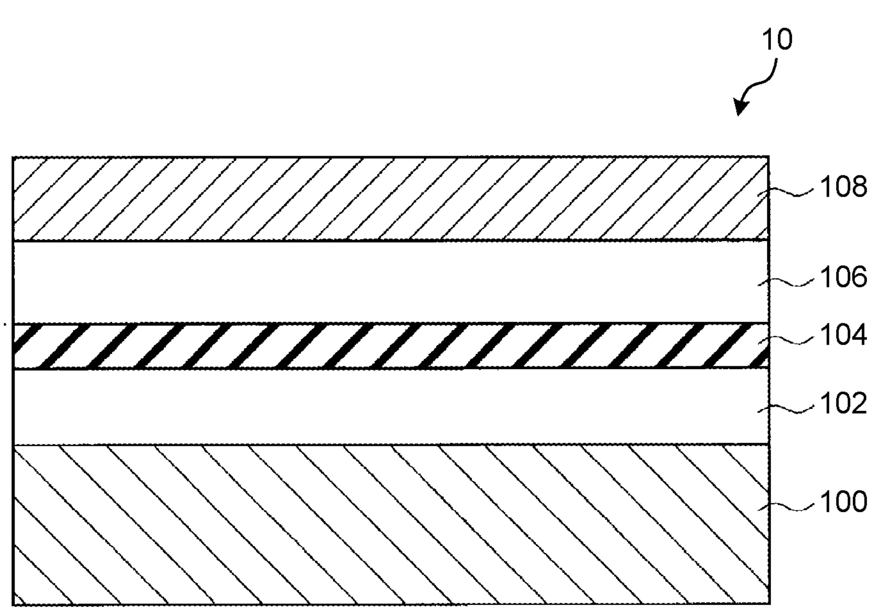
FIG. 2 is a cross-sectional view illustrating an example of a schematic configuration of a storage element according to the first embodiment.

A configuration example (basic structure) of the MTJ element 10 of the storage element according to the first embodiment, for example, an STT-MRAM using spin torque magnetization reversal will be described with reference to FIG. 2. FIG. 2 is a cross-sectional view illustrating an example of a schematic configuration of the MTJ element 10. The MTJ element 10 is a magnetic storage element that stores one piece of information (1/0).

As illustrated in FIG. 2, the MTJ element 10 includes a base layer 100, a fixed layer 102, an insulating layer (intermediate layer) 104, the storage layer 106, and a cap layer 108. The base layer 100, the fixed layer 102, the insulating layer 104, the storage layer 106, and the cap layer 108 are stacked in the described order. The insulating layer 104 is also referred to as a tunnel insulating layer (tunnel barrier layer).

The MTJ element 10 defines "0" and "1" of information by a relative angle between the magnetization of the fixed layer 102 and the magnetization of the storage layer 106. For example, the MTJ element 10 forms a perpendicular magnetization type STT-MRAM. That is, the magnetization direction of the magnetic layers (the fixed layer 102 and the storage layer 106) included in the stacked structure of the MTJ element 10 is a direction perpendicular to the film surface (layer surface), in other words, the stacking direction of the stacked structure.

Although not illustrated in the example of FIG. 2, the MTJ element 10 is sandwiched between the upper electrode and the lower electrode (each contact layer 208, 210: refer to FIG. 1). In the MTJ element 10, a voltage is applied between the lower electrode and the upper electrode of the MTJ element 10 via the gate electrode (word line) 72 and the bit line 70, and information is written to and read from the storage layer 106 of the MTJ element 10.

It is described that, in the MTJ element 10, the magnetization direction of the storage layer 106 is reversed by spin torque magnetization reversal, but the magnetization direction of the fixed layer 102 is not reversed, that is, the magnetization direction is fixed. In addition, the insulating layer 104 is sandwiched between the fixed layer 102 and the storage layer 106.

The base layer 100 is provided on the semiconductor substrate 200 via the lower electrode. For example, the base layer 100 is formed of a film for controlling crystal orientation of the fixed layer 102 and improving adhesion strength to the lower electrode.

The fixed layer 102 is a layer, the magnetization direction of which is fixed (magnetization fixed layer). The fixed layer 102 is formed of a ferromagnetic body having a magnetic moment, the magnetization direction of which is fixed in the perpendicular direction, and the direction of the magnetic moment thereof is fixed by a high coercive force or the like. The fixed layer 102 is formed in, for example, a stacked ferri-pin structure including at least two ferromagnetic layers and a non-magnetic layer.

The insulating layer 104 is formed of various non-magnetic bodies and the like, and is provided so as to be sandwiched between the fixed layer 102 and the storage layer 106. The insulating layer 104 is a layer formed of an insulating material such as MgO. In addition to the above-described materials, the insulating layer 104 can also be configured using, for example, various insulators, dielectrics, and semiconductors such as $Al_2O_3$, AlN, $SiO_2$, $Bi_2O_3$, $MgF_2$, CaF, $SrTiO_2$, $AlLaO_3$, and Al—N—O.

The storage layer 106 is a layer, the magnetization direction of which is changeable, for example, reversible. The storage layer 106 is formed of a ferromagnetic body having a magnetic moment in which the direction of magnetization freely changes in the perpendicular direction, and the direction of the magnetic moment thereof changes according to information to be stored. The storage layer 106 stores information according to the magnetization state of the magnetic body, and may be formed of one layer or may have a structure in which a plurality of layers are stacked. The information is stored by the magnetization direction of the storage layer 106 having uniaxial anisotropy.

For example, writing is performed by applying a current to the storage layer 106 in the perpendicular direction and causing spin torque magnetization reversal. That is, when a write current flowing in the stacking direction of the storage layer 106 and the fixed layer 102 is applied, the magnetization direction of the storage layer 106 changes, and information is stored in the storage layer 106. It is noted that the fixed layer 102 is provided via the insulating layer 104 of the tunnel barrier film with respect to the storage layer 106 in which the magnetization direction is reversed by spin injection, and is used as a reference of storage information (magnetization direction) of the storage layer 106.

The cap layer 108 is formed of, for example, various metal materials such as Ta, an alloy material, an oxide material, or the like. The cap layer 108 protects each stack during the manufacturing of the MTJ element 10. The cap layer 108 may function as a hard mask.

The MTJ element 10 having such a stacked structure is manufactured, for example, by continuously forming the base layer 100 to the cap layer 108 in a vacuum apparatus, and then forming a pattern of the MTJ element 10 by processing such as etching. The MTJ elements 10 are arranged in a row-and-column shape (matrix shape) (refer to FIG. 1).

Here, for example, Co—Fe—B is used as the storage layer 106 and the fixed layer 102. Since the fixed layer 102 is a reference of information, the magnetization direction thereof should not be changed by recording or reading. However, the magnetization direction of the fixed layer 102 is not necessarily fixed in a specific direction, and the magnetization thereof may be made less likely to move than the storage layer 106 by increasing a coercive force, a film thickness, or a magnetic damping constant as compared with the storage layer 106.

When the magnetization is fixed, an anti-ferromagnetic body such as PtMn or IrMn may be brought into contact with the fixed layer 102, or a magnetic body brought into contact with the anti-ferromagnetic body may be magnetically coupled via a non-magnetic body such as Ru to indirectly fix the fixed layer 102.

In addition, in a perpendicular magnetization film in the storage layer 106, composition is adjusted such that the magnitude of an effective demagnetizing field received by the perpendicular magnetization film is smaller than a saturation magnetization amount Ms. As described above, the ferromagnetic material Co—Fe—B composition of the storage layer 106 is selected, and the magnitude of the effective demagnetizing field received by the storage layer 106 is reduced so as to be smaller than the saturation magnetization amount Ms of the storage layer 106. As a result, the magnetization of the storage layer 106 is oriented in the perpendicular direction.

In addition, in a case where the insulating layer 104, which is a tunnel barrier layer, is formed of MgO (magnesium oxide), a magnetoresistance ratio (MR ratio) can be increased. By increasing the MR ratio in this manner, the efficiency of spin injection in the MTJ element 10 can be improved, and current density necessary for reversing the magnetization direction of the storage layer 106 can be reduced. In the present embodiment, the material of the insulating layer 104 as the intermediate layer may be replaced with a metal material, and spin injection may be performed by a giant magnetoresistance (GMR) effect.

According to the configuration of the MTJ element 10 described above, the storage layer 106 is configured such that the magnitude of the effective demagnetizing field received by the storage layer 106 is smaller than the saturation magnetization amount Ms of the storage layer 106. As a result, the demagnetizing field received by the storage layer 106 is reduced, and the amount of write current necessary for reversing the magnetization direction of the storage layer 106 can be reduced. This is because the reversal current of the perpendicular magnetization type STT-MRAM is applied because the storage layer 106 has perpendicular magnetic anisotropy, which is advantageous in terms of the demagnetizing field. In addition, since the amount of write current can be reduced without reducing the saturation magnetization amount Ms of the storage layer 106, it is possible to secure thermal stability of the storage layer 106 by setting the saturation magnetization amount Ms of the storage layer 106 to a sufficient amount. As a result, the MTJ element 10 having an excellent characteristic balance can be configured.

In addition, since the fixed layer 102 has a stacked ferri-pin structure, the sensitivity of the fixed layer 102 is reduced with respect to the external magnetic field, a leakage magnetic field caused by the fixed layer 102 is blocked, and the perpendicular magnetic anisotropy of the fixed layer 102 can be enhanced by interlayer coupling of a plurality of magnetic layers. As described above, since the thermal stability as an information storage ability can be sufficiently secured, the MTJ element 10 having an excellent characteristic balance can be configured. It is noted that such a method of fixing the magnetization direction of the fixed layer 102 can be used regardless of whether the fixed layer 102 is disposed below or above the storage layer 106.

Here, a structure in which the stacked ferri-pin structure is provided on the lower side (that is, the base layer 100 side) with respect to the storage layer 106 is also referred to as a bottom pin structure, and a structure in which the stacked ferri-pin structure is provided on the upper side (that is, the cap layer 108 side) with respect to the storage layer 106 is also referred to as a top pin structure. That is, the MTJ element 10 may have either the bottom pin structure or the top pin structure.

It is noted that, in the example of FIG. 2, a structure in which the insulating layer 104 and the fixed layer 102 are stacked in the downward direction with respect to the storage layer 106 is illustrated as a stacked structure of the MTJ element 10, but the structure of the MTJ element 10 is not particularly limited. For example, another layer may be added to the MTJ element 10, or the positions of the fixed layer 102 and the storage layer 106 may be interchanged to configure the MTJ element 10. As an example, the MTJ element 10 may be configured by adding an insulating layer (upper tunnel barrier layer) and a fixed layer (upper magnetization fixed layer) between the storage layer 106 and the cap layer 108 in the described order. In this case, the fixed layer 102 functions as a lower magnetization fixed layer, and the insulating layer 104 functions as a lower tunnel barrier layer.

1-3. Writing and Reading of Storage Element

A mechanism of writing and reading information in and from the MTJ element 10 will be described. First, a mechanism of writing information in the MTJ element 10 will be described. In the MTJ element 10, writing of information to the storage layer 106 is performed using the spin torque magnetization reversal as described above.

Here, details of the spin torque magnetization reversal will be described. It is known that electrons have two kinds of spin angular momentum. Therefore, the spin angular momentum is defined as two types of spin angular momenta including upward spin angular momentum and downward spin angular momentum. In the non-magnetic body, the upward spin angular momentum and the downward spin angular momentum are the same in number, and in the ferromagnetic body, there is a difference in the number of both.

Furthermore, here, a case is considered in which, in the MTJ element 10, the directions of the magnetic moments of the fixed layer 102 and the storage layer 106 are in an anti-parallel state in which the directions thereof are different from each other, and in this state, electrons are caused to enter the storage layer 106 from the fixed layer 102.

When the electrons pass through the fixed layer 102, spin polarization occurs, that is, a difference occurs in the number of upward spin angular momentum and downward spin angular momentum. Furthermore, in a case where the thickness of the insulating layer 104 is sufficiently thin, the electrons can enter the storage layer 106 before the spin polarization relaxes and becomes a non-polarized state (the number of upward and downward electrons is the same) in a normal non-magnetic body.

In the storage layer 106, the direction of spin polarization is opposite to that of electrons having entered the storage layer 106. Therefore, in order to lower the energy of the entire system, some of the entered electrons are reversed, that is, the direction of the spin angular momentum changes. At this time, since the spin angular momentum is stored in the entire system, a reaction equivalent to a total change in spin angular momentum due to the reversed electrons is applied to the magnetic moment (magnetization direction) of the storage layer 106.

In a case where the current, that is, the number of electrons passing in a unit time is small, the total number of electrons that change the direction is also small, and as such the spin angular momentum change generated in the magnetic moment of the storage layer 106 is also small. On the other hand, when the current, that is, the number of electrons passing in a unit time is increased, a desired spin angular momentum change can be given to the magnetic moment of the storage layer 106 in the unit time. A temporal change of the spin angular momentum is torque, and when the torque exceeds a predetermined threshold value, the magnetic moment of the storage layer 106 starts to be reversed and becomes stable in a state of being reversed by 180 degrees. It is noted that the reason why the magnetic moment of the storage layer 106 is stable in a state of being reversed by 180 degrees is that there is an easy magnetization axis in the magnetic body forming the storage layer 106 and there is uniaxial anisotropy. By the mechanism as described above, the MTJ element 10 changes from the anti-parallel state to a parallel state in which the directions of the magnetic moments of the fixed layer 102 and the storage layer 106 are the same.

In addition, in the parallel state, in a case where a current is reversely caused to flow in a direction in which electrons enter from the storage layer 106 to the fixed layer 102, the electrons reversed by being reflected by the fixed layer 102 when reaching the fixed layer 102 apply torque to the storage layer 106 when entering the storage layer 106. Therefore, the magnetic moment of the storage layer 106 is reversed by the applied torque, and the MTJ element 10 changes from the parallel state to the anti-parallel state.

However, the current amount of the reversal current for causing reversal from the parallel state to the anti-parallel state is larger than that in the case of reversal from the anti-parallel state to the parallel state. It is noted that, regarding the reversal from the parallel state to the anti-parallel state, briefly, since the magnetic moment of the fixed layer 102 is fixed, the reversal in the fixed layer 102 is difficult, and the magnetic moment of the storage layer 106 is reversed in order to save the spin angular momentum of the entire system. As described above, storage of 1/0 in the MTJ element 10 is performed by causing a current equal to or larger than a predetermined threshold value corresponding to each polarity to flow in a direction from the fixed layer 102 toward the storage layer 106 or in the opposite direction. As described above, writing of 1/0 in the MTJ element 10 is performed by reversing the magnetic moment of the storage layer 106 in the MTJ element 10 and changing the resistance state of the MTJ element 10.

Next, a mechanism of reading information in the MTJ element 10 will be described. In the MTJ element 10, reading of information from the storage layer 106 is performed using the magnetoresistance effect. Specifically, in a case where a current is caused to flow between the lower electrode (not illustrated) and the upper electrode (not illustrated) sandwiching the MTJ element 10, the resistance state of the MTJ element 10 changes based on whether the directions of the magnetic moments of the fixed layer 102 and the storage layer 106 are in the parallel state or in the anti-parallel state. Then, the information stored in the storage layer 106 can be read by determining the resistance state of the MTJ element 10, that is, the magnitude of the electrical resistance indicated by the MTJ element 10.

1-4. STT-MRAM of In-Plane Magnetization Type and Perpendicular Magnetization Type The STT-MRAM includes an in-plane magnetization type STT-MRAM using a magnetic body having magnetic anisotropy in the in-plane direction and a perpendicular magnetization type STT-MRAM using a magnetic body having magnetic anisotropy in the perpendicular direction. In general, the perpendicular magnetization type STT-MRAM is considered to be more suitable for reducing power and increasing capacity than the in-plane magnetization type STT-MRAM. This is because the perpendicular magnetization type STT-MRAM has a lower energy barrier to be exceeded at the time of spin torque magnetization reversal, and is advantageous in maintaining the thermal stability of a storage carrier in which the high magnetic anisotropy of a perpendicular magnetization film is miniaturized due to an increase in capacity.

Specifically, on the assumption that that the reversal current of the in-plane magnetization type STT-MRAM is Ic_para, the reversal current from the parallel state to the anti-parallel state becomes $$Ic\_para=(A\cdot\alpha\cdot Ms\cdot V/g(0)/P)(Hk+2\pi Ms), \text{ and}$$

the reversal current from the anti-parallel state to the parallel state becomes $$Ic\_para=-(A\cdot\alpha\cdot Ms\cdot V/g(\pi)/P)(Hk+2\pi Ms).$$

In addition, on the assumption that the reversal current of the perpendicular magnetization type STT-MRAM is Ic_perp, the reversal current from the parallel state to the anti-parallel state becomes $$Ic\_perp=(A\cdot\alpha\cdot Ms\cdot V/g(0)/P)(Hk-4\pi Ms), \text{ and}$$

the reversal current from the anti-parallel state to the parallel state becomes $$Ic\_perp=-(A\cdot\alpha\cdot Ms\cdot V/g(\pi)/P)(Hk-4\pi Ms).$$

It is noted that A is a constant, α is a damping constant, Ms is saturation magnetization, V is element volume, g(0)P and g(π)P are coefficients corresponding to efficiency at which spin torque is transmitted to a counterpart magnetic layer in the parallel state and the anti-parallel state, respectively, and Hk is magnetic anisotropy.

In each of the above expressions, when (Hk−4 πMs) in the case of the perpendicular magnetization type is compared with (Hk+2πMs) in the case of the in-plane magnetization type, it can be understood that the perpendicular magnetization type is more suitable for reducing the storage current. That is, (Hk−4 πMs) in the case of the perpendicular magnetization type STT-MRAM is smaller than (Hk+2πMs) in the case of the in-plane magnetization type STT-MRAM. Therefore, it can be seen that the perpendicular magnetization type STT-MRAM has a small reversal current and is more suitable from the viewpoint of reducing the reversal current at the time of writing.

1-5. Overall Configuration Example of Storage Device

Figure 3:
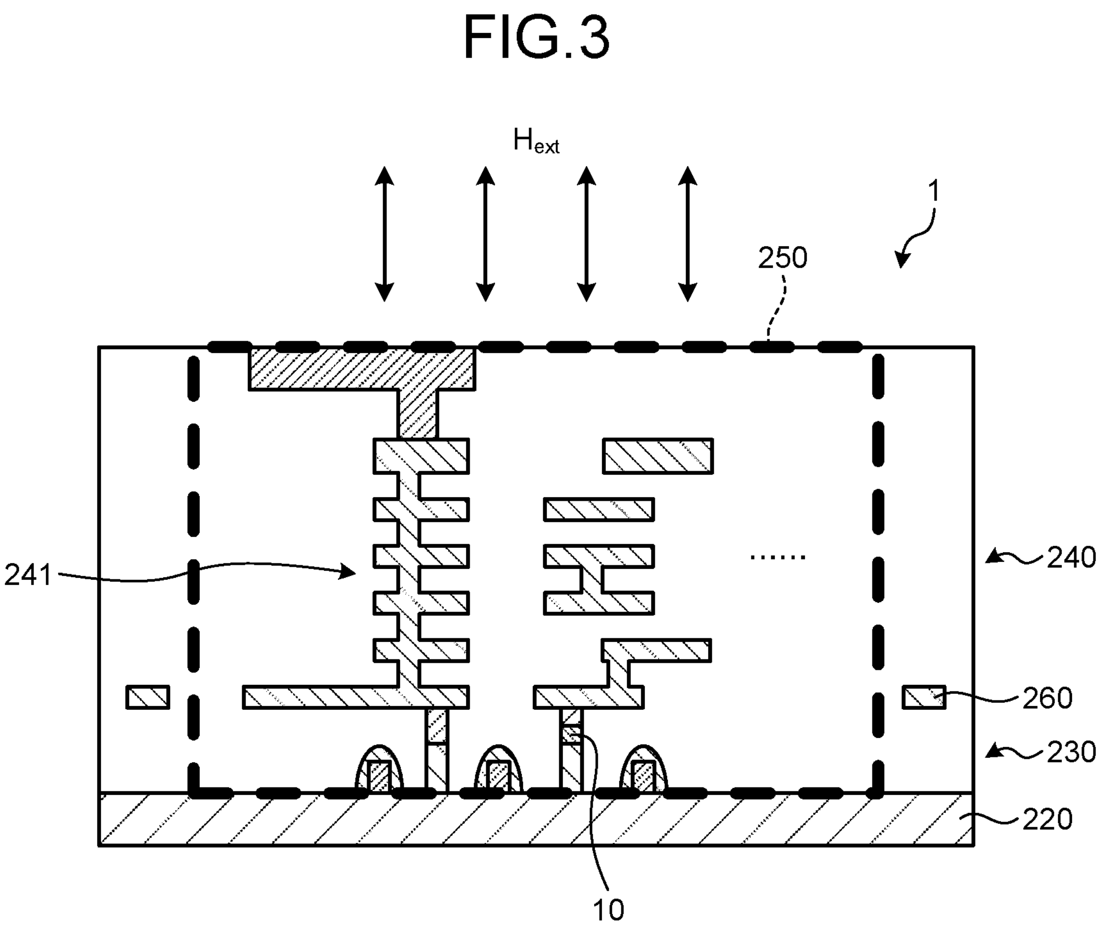
FIG. 3 is a cross-sectional view illustrating an example of an overall configuration of the storage device according to the first embodiment.
Figure 4:
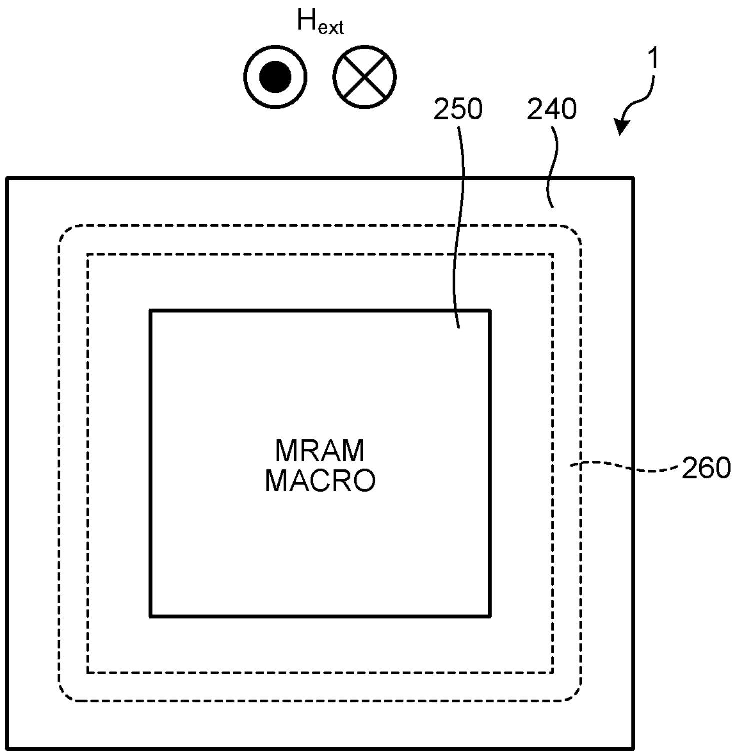
FIG. 4 is a plan view illustrating the example of the overall configuration of the storage device according to the first embodiment.

An overall configuration example of the storage device 1 according to the first embodiment will be described with reference to FIGS. 3 and 4. FIG. 3 is a cross-sectional view illustrating an example of the overall configuration of the storage device 1 according to the first embodiment. FIG. 4 is a plan view illustrating an example of the overall configuration of the storage device 1 according to the first embodiment.

As illustrated in FIGS. 3 and 4, the storage device 1 includes a semiconductor substrate 220, an element layer 230, and a wiring layer 240. The element layer 230 and the wiring layer 240 are stacked on the semiconductor substrate 200 in this order.

The element layer 230 includes various elements (for example, the plurality of MTJ elements 10, the plurality of selection transistors 20, and the like: refer to FIG. 1), an address wiring (for example, the bit line 70 and the word line (the gate electrode 72): refer to FIG. 1), an insulating layer, and the like. The wiring layer 240 includes various circuits, various wirings (for example, a wiring 241: refer to FIG. 3), an insulating layer, and the like. It is noted that each of the element layer 230 and the wiring layer 240 includes a plurality of layers.

A memory unit (MRAM macro) 250 is a portion having a predetermined rectangular parallelepiped region including various elements and address wirings of the element layer 230, various circuits and various wirings of the wiring layer 240, and the like. A short-circuit winding 260 is provided so as to surround the memory unit 250.

The short-circuit winding 260 is positioned in the vicinity of the MTJ element 10 as illustrated in FIG. 3, and is provided in the wiring layer 240 so as to surround the memory unit 250, as illustrated in FIGS. 3 and 4. For example, the short-circuit winding 260 is provided in the lowermost layer included in the wiring layer 240. The short-circuit winding 260 is formed of the same material as various circuits and various wirings (for example, wiring or the like electrically connected to the MTJ element 10) included in the wiring layer 240. The short-circuit winding 260 has conductivity. As illustrated in FIG. 4, the short-circuit winding 260 is formed in an annular shape. In the example of FIG. 4, the annular shape of the short-circuit winding 260 is a square annular shape in plan view. The short-circuit winding 260 is formed in an endless shape, and is, for example, a single winding.

According to such a configuration, the annular short-circuit winding 260 is disposed, for example, in the lowermost layer of the wiring layer 240 so as to surround the memory unit 250. As a result, since a reverse magnetic field is generated by the short-circuit winding 260, the external magnetic field intensity is reduced. Therefore, the write error rate and the storage error rate can be improved with a simple configuration in which only the short-circuit winding 260 is provided. Therefore, it is possible to reduce an error caused by the external magnetic field at low cost.

It is noted that the layer in which the short-circuit winding 260 is provided is not limited to the lowermost layer of the wiring layer 240, and may be any one of the layers included in the wiring layer 240. However, it is desirable that the short-circuit winding 260 is close to a layer in which the MTJ element 10 is present. Therefore, the fact that the short-circuit winding 260 is positioned in the vicinity of the MTJ element 10 means that, for example, the short-circuit winding 260 is positioned in a layer within a predetermined number of layers (for example, 10 layers) from the layer in which the MTJ element 10 is present.

Further, the short-circuit winding 260 is provided such that an inner region of a ring is positioned above the MTJ element 10, but is not limited thereto. For example, the short-circuit winding 260 may be formed such that the inner region of the ring is positioned below the MTJ element 10. In addition, the short-circuit winding 260 may be formed so as to surround the MTJ element 10. In this case, the short-circuit winding 260 may be formed, for example, in the same layer as the layer in which the MTJ element 10 is present.

In addition, the short-circuit winding 260 is desirably disposed outside the region of the memory unit 250. It is noted that, in order not to increase a chip area (area of the storage device 1), it is desirable that the short-circuit winding 260 is disposed near the memory unit 250, and it is desirable that the short-circuit winding 260 is disposed at least inside a pad region in which the chip (the storage device 1) is mounted.

1-6. Specific Example of Effects of Short-Circuit Winding

A specific example of effects of the short-circuit winding 260 according to the first embodiment will be described with reference to FIGS. 5 and 6.

Figure 5:
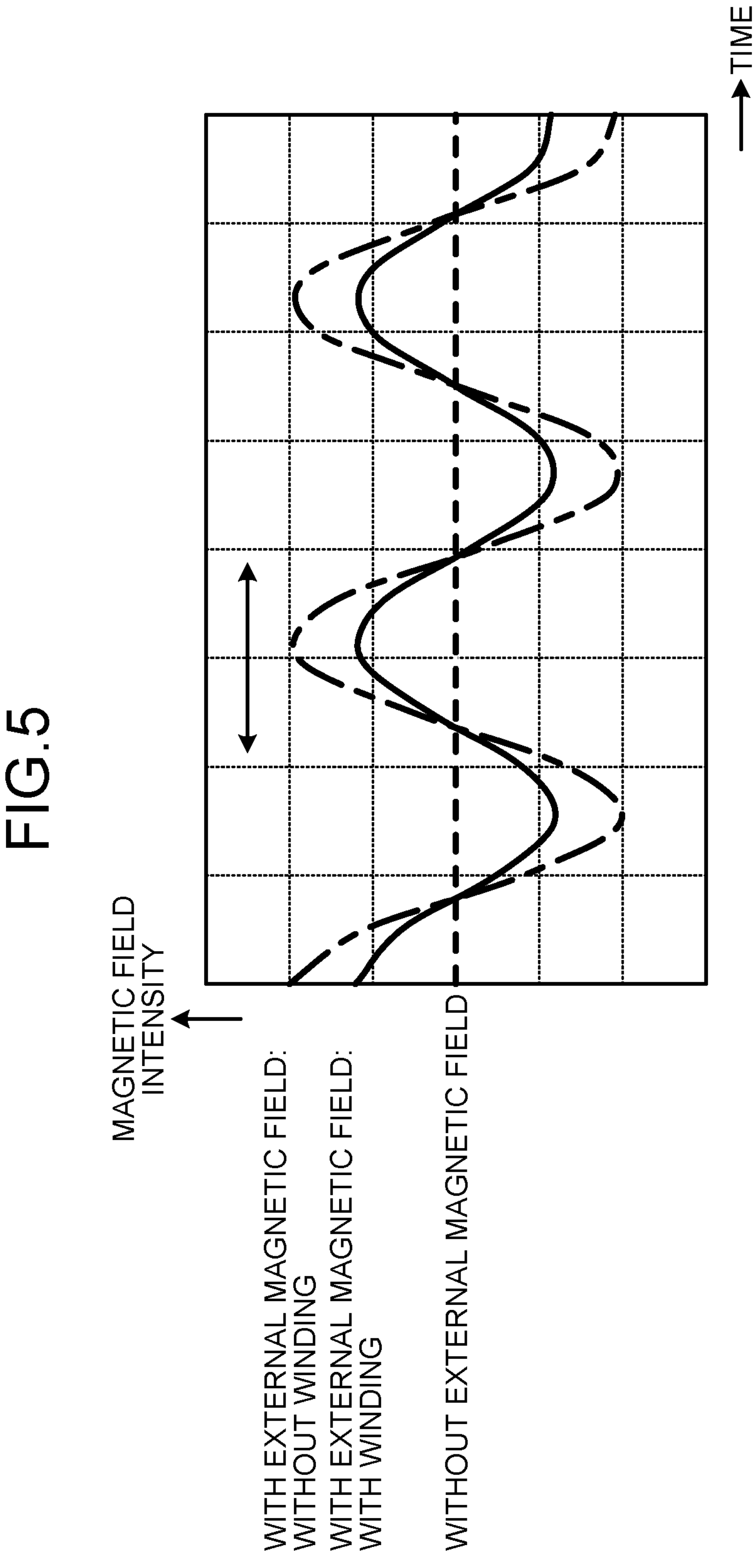
FIG. 5 is a graph illustrating a time variation in magnetic field intensity received from an external magnetic field according to the first embodiment.

FIG. 5 is a graph illustrating a time variation in magnetic field intensity received from the external magnetic field according to the first embodiment. The horizontal axis represents time, and the vertical axis represents magnetic field intensity. It is noted that a magnetic field is generated near the memory unit 250 in the storage device 1 by the external magnetic field.

As illustrated in FIG. 5, the magnetic field intensity of the first embodiment (with external magnetic field: with short-circuit winding) is lower than a magnetic field intensity of a comparative example (with external magnetic field: without short-circuit winding). In the first embodiment, due to the effect of the short-circuit winding 260, a magnetic field in a direction opposite to the external magnetic field is generated at the position of the memory unit 250 by electromagnetic induction. A part of the external magnetic field is offset by the magnetic field, and the external magnetic field intensity as a sum is reduced.

It is noted that, for example, "Park et al., IEEE TRANSACTIONS ON ELECTROMAGNETIC COMPATIBILITY, VOL. 59, NO. 2, APRIL 2017" illustrates an example of the reduction of the magnetic field by the short-circuit winding.

Figure 6:
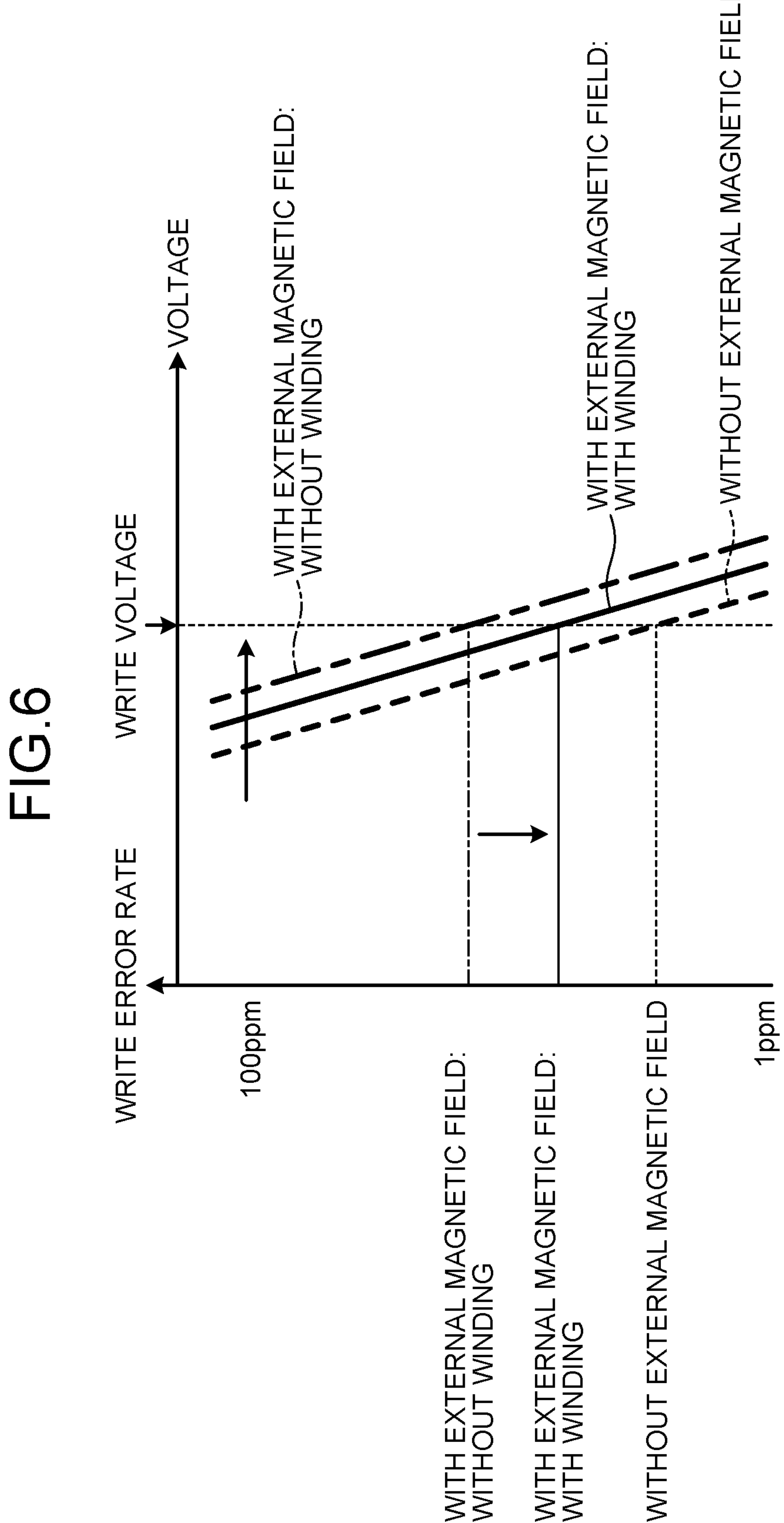
FIG. 6 is a graph illustrating a variation in a write error rate due to the external magnetic field according to the first embodiment.

FIG. 6 is a graph illustrating a variation in write error rate due to the external magnetic field according to the first embodiment. The horizontal axis represents a write voltage, and the vertical axis represents a write error rate. In general, the higher the write voltage, the higher the write success probability and the lower the write error rate.

As illustrated in FIG. 6, the write error rate of the first embodiment (with external magnetic field: with short-circuit winding) is lower than a write error rate of the comparative example (with external magnetic field: without short-circuit winding). In the first embodiment and the comparative example, due to the presence of the external magnetic field, the error rate is higher than that in a virtual case where there is no external magnetic field (case where there is no external magnetic field). However, in the first embodiment (with external magnetic field: with short-circuit winding), since the external magnetic field intensity is reduced, the write error rate is reduced as compared with the comparative example.

1-7. Method of Manufacturing Storage Device

An example of a method of manufacturing the storage device 1 according to the first embodiment will be described with reference to FIG. 7. FIG. 7 is a flowchart illustrating an example of a manufacturing step of the storage device 1 according to the first embodiment.

As illustrated in FIG. 7, in step S1, a front-end process (for example, wafer manufacturing) is performed, and in step S2, MRAM formation is performed. This forming step includes a step of forming various elements such as the MTJ element 10 and the selection transistor 20. In the forming step, PVD, patterning, and etching are performed. In step S3, a wiring step is performed. This wiring step includes a forming step of forming various circuits and various wirings, and a winding forming step of forming the short-circuit winding 260. In step S4, dicing is performed, and in step S5, assembly is performed. As a result, the storage device 1 is completed. In step S6, selection (selection of acceptance and rejection) is performed, and in step S7, shipment (shipment of a passed product) is performed.

1-8. Action and Effects

As described above, according to the first embodiment, the annular short-circuit winding 260 having conductivity is provided for the storage element (for example, the MTJ element 10) having the storage layer 106, the magnetization direction of which is changeable. As a result, since a reverse magnetic field is generated by the short-circuit winding 260, the external magnetic field intensity is reduced. Therefore, the write error rate and the storage error rate can be improved with a simple configuration in which only the short-circuit winding 260 is provided. Therefore, it is possible to reduce an error caused by the external magnetic field at low cost.

In addition, the short-circuit winding 260 may be provided in the vicinity of the storage element. As a result, since the reverse magnetic field by the short-circuit winding 260 is reliably generated around the storage element, the external magnetic field intensity can be reliably reduced. As a result, it is possible to reliably reduce an error caused by the external magnetic field. The short-circuit winding 260 being located near the storage element (for example, the MTJ element 10) means that, for example, the short-circuit winding 260 is located in a layer within a predetermined number of layers (for example, 10 layers) from the layer in which the storage element is present.

In addition, the wiring layer 240 including the wiring 241 connected to the storage element may be provided, and the short-circuit winding 260 may be provided in the wiring layer 240. As a result, when the wiring 241 of the wiring layer 240 is formed, the short-circuit winding 260 can be formed in the same step, so that the manufacturing time can be shortened and the cost can be reduced as compared with a case in which the wiring 241 and the short-circuit winding 260 are formed in separate steps.

The short-circuit winding 260 may be made of the same material as that of the wiring 241. As a result, when the wiring 241 of the wiring layer 240 is formed, the short-circuit winding 260 can be formed without changing a material, so that the manufacturing time can be shortened and the cost can be reduced as compared with a case in which the wiring 241 and the short-circuit winding 260 are formed by changing a material.

In addition, the element layer 230 including the storage element may be provided, the wiring layer 240 may be stacked on the element layer 230, and the short-circuit winding 260 may be provided in the wiring layer 240. As a result, the short-circuit winding 260 is present at a position close to the storage element. Therefore, since the reverse magnetic field by the short-circuit winding 260 is reliably generated around the storage element, the external magnetic field intensity can be reliably reduced. As a result, it is possible to reliably reduce an error caused by the external magnetic field.

In addition, the short-circuit winding 260 may be formed such that the inner region of the ring is positioned above or below the storage element. Accordingly, a degree of freedom in designing the short-circuit winding 260 can be improved.

Further, the short-circuit winding 260 may be formed so as to surround the storage element. As a result, since the reverse magnetic field by the short-circuit winding 260 is reliably generated around the storage element, the external magnetic field intensity can be reliably reduced. As a result, it is possible to reliably reduce an error caused by the external magnetic field.

In addition, a plurality of storage elements may be provided, and the short-circuit winding 260 may be provided for each storage element. In this case as well, since the reverse magnetic field is generated by the short-circuit winding 260, the external magnetic field intensity can be reliably reduced. As a result, it is possible to reliably reduce an error caused by the external magnetic field.

2. SECOND EMBODIMENT

2-1. Overall Configuration Example of Storage Device

Figure 8:
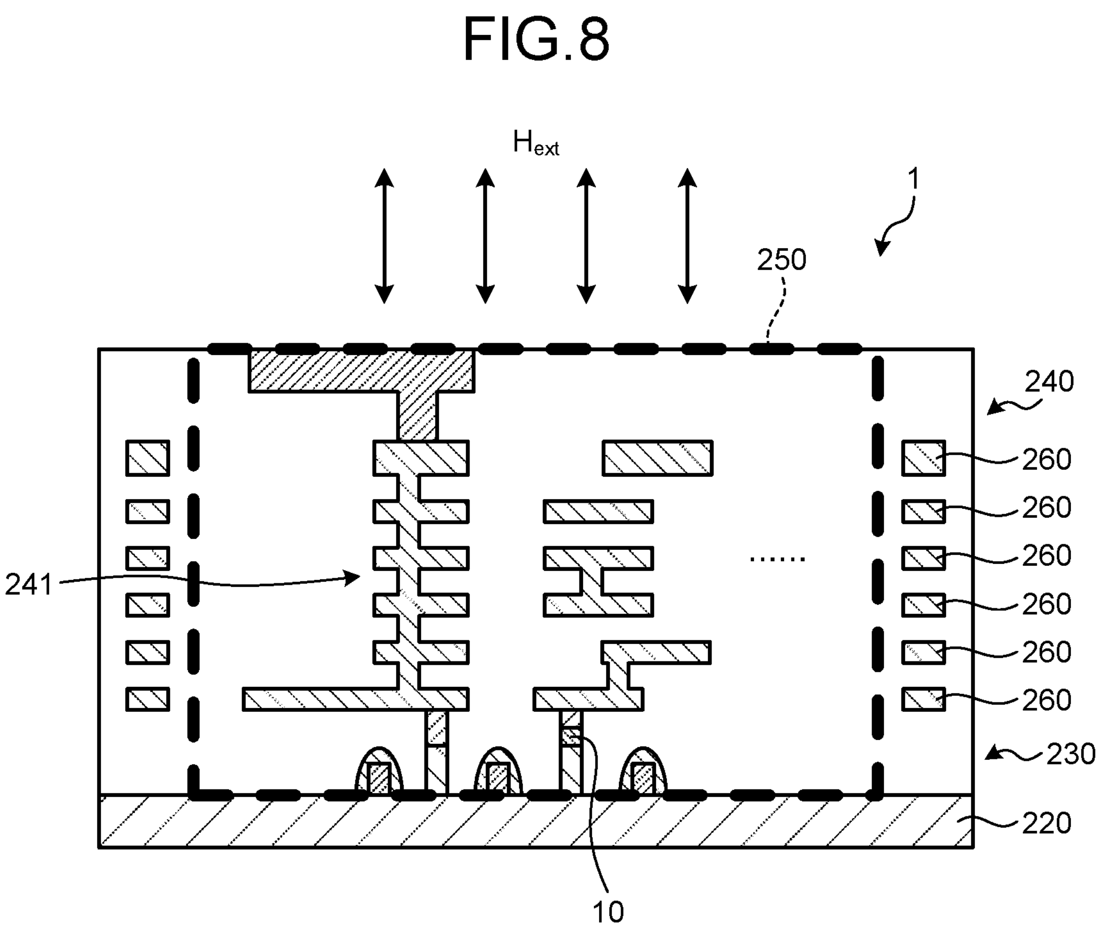
FIG. 8 is a cross-sectional view illustrating an example of an overall configuration of a storage device according to a second embodiment.

An overall configuration example of a storage device 1 according to a second embodiment will be described with reference to FIG. 8. FIG. 8 is a cross-sectional view illustrating an example of the overall configuration of the storage device 1 according to the second embodiment. Hereinafter, portions different from those of the first embodiment will be mainly described, and other descriptions will be omitted.

As illustrated in FIG. 8, a plurality of annular short-circuit windings 260 is provided. These short-circuit windings 260 are arranged in the height direction (vertical direction in FIG. 8) of the storage device 1 and provided in a wiring layer 240. For example, the short-circuit windings 260 are provided in a plurality of predetermined layers included in the wiring layer 240. As a result, the effect of reducing the external magnetic field can be enhanced. The respective short-circuit windings 260 may be electrically connected to each other by a via which is a conduction hole. It is noted that the planar shape of the annular short-circuit winding 260 is the same as the annular planar shape illustrated in FIG. 4.

2-2. Action and Effects

As described above, according to the second embodiment, the same effects as those of the first embodiment can be obtained. Further, the short-circuit winding 260 is a single winding, and a plurality of short-circuit windings are provided. As a result, since the reverse magnetic field by each short-circuit winding 260 is increased, the external magnetic field intensity can be reliably reduced. As a result, it is possible to reliably reduce an error caused by the external magnetic field.

The plurality of short-circuit windings 260 may be arranged in the height direction. As a result, the reverse magnetic field by each short-circuit winding 260 can be reliably strengthened, so that the external magnetic field intensity can be more reliably reduced.

The plurality of short-circuit windings 260 may be connected to each other by a via. As a result, the reverse magnetic field by each short-circuit winding 260 can be reliably strengthened, so that the external magnetic field intensity can be more reliably reduced.

3. THIRD EMBODIMENT

3-1. Overall Configuration Example of Storage Device

Figure 9:
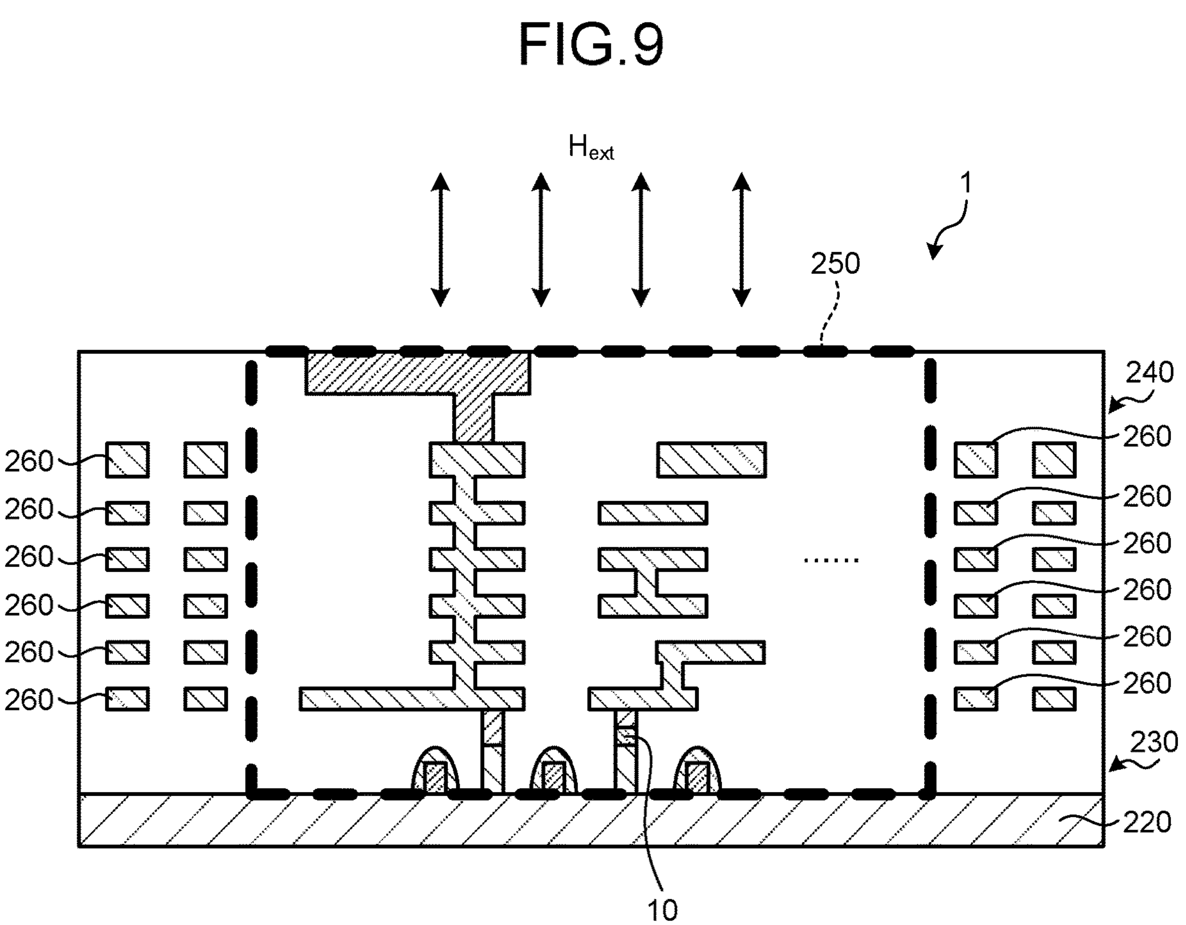
FIG. 9 is a cross-sectional view illustrating an example of an overall configuration of a storage device according to a third embodiment.
Figure 10:
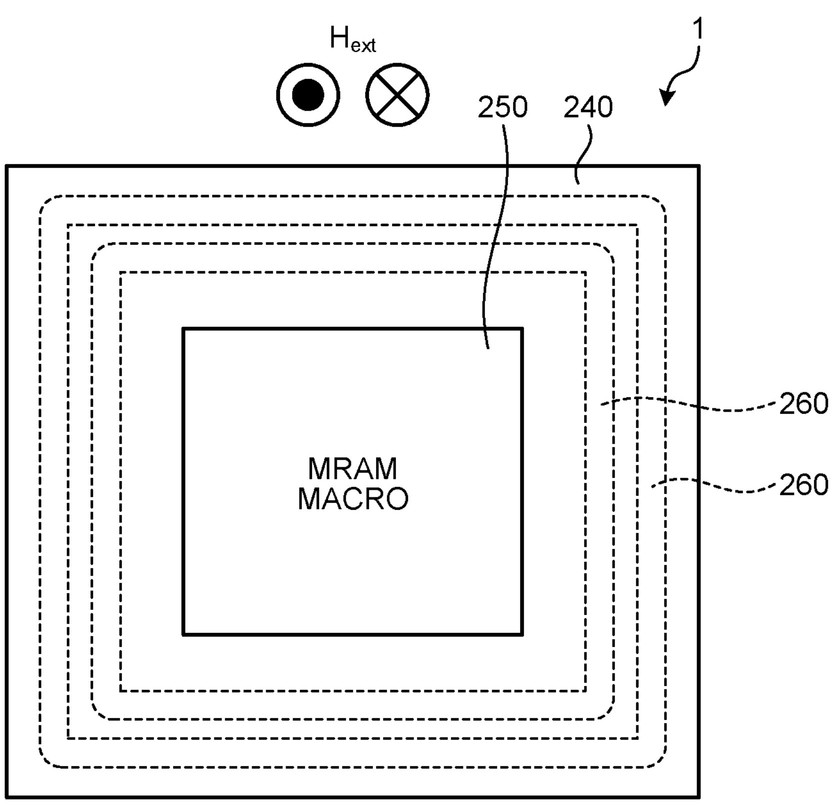
FIG. 10 is a plan view illustrating an example of the overall configuration of the storage device according to the third embodiment.

An overall configuration example of a storage device 1 according to a third embodiment will be described with reference to FIGS. 9 and 10. FIG. 9 is a cross-sectional view illustrating an example of the overall configuration of the storage device 1 according to the third embodiment. FIG. 10 is a plan view illustrating an example of the overall configuration of the storage device 1 according to the third embodiment. Hereinafter, portions different from those of the second embodiment will be mainly described, and other descriptions will be omitted.

As illustrated in FIGS. 9 and 10, a plurality of annular short-circuit windings 260 are provided. Further, a plurality of annular short-circuit windings 260 are also provided outside the short-circuit windings 260. These short-circuit windings 260 are arranged in the height direction (vertical direction in FIG. 9) of the storage device 1 and provided in a wiring layer 240. For example, the short-circuit windings 260 are respectively provided in a plurality of predetermined layers included in the wiring layer 240. As a result, the effect of reducing the external magnetic field can be further enhanced. The respective short-circuit windings 260 may be electrically connected to each other by a via which is a conduction hole.

As illustrated in FIG. 10, the respective short-circuit windings 260 are provided in the shape of concentric ring (in the example of FIG. 10, concentric quadrangle). The concentric ring is a plurality of rings that share a center. Examples of the concentric ring include a concentric circle, a concentric ellipse, and a concentric hexagon, and the shape thereof is not limited.

3-2. Action and Effects

As described above, according to the third embodiment, the same effects as those of the first and second embodiments can be obtained. Further, the plurality of short-circuit windings 260 are provided in a concentric annular shape. As a result, since the reverse magnetic field by each short-circuit winding 260 is increased, the external magnetic field intensity can be reliably reduced. As a result, it is possible to reliably reduce an error caused by the external magnetic field.

4. Fourth Embodiment

4-1. Overall Configuration Example of Storage Device

Figure 11:
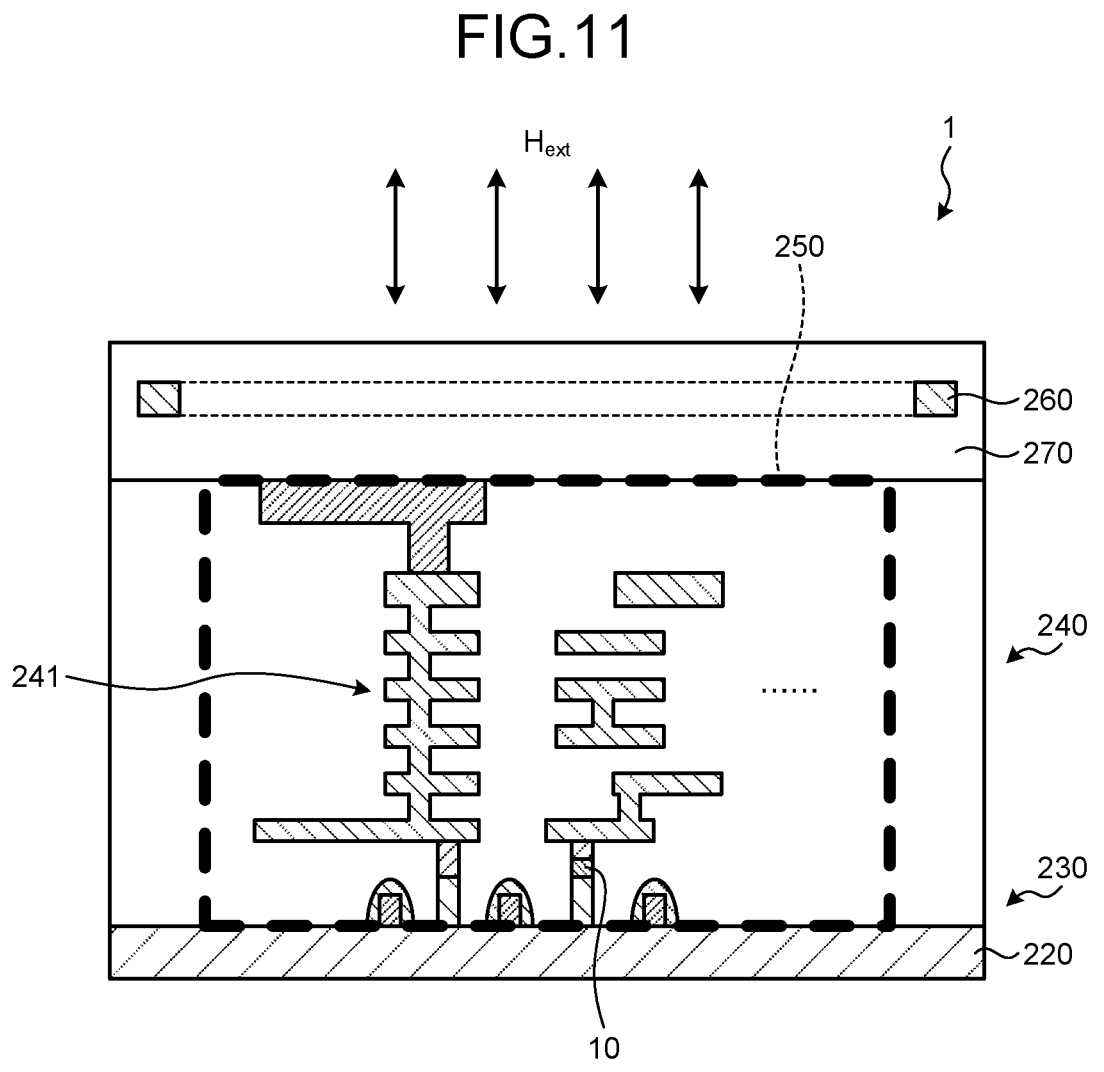

An overall configuration example of a storage device 1 according to a fourth embodiment will be described with reference to FIG. 11. FIG. 11 is a cross-sectional view illustrating an example of the overall configuration of the storage device 1 according to the fourth embodiment. Hereinafter, portions different from those of the first embodiment will be mainly described, and other descriptions will be omitted.

As illustrated in FIG. 11, an annular short-circuit winding 260 is provided in a predetermined layer 270 stacked on a wiring layer 240. As a result, the effect of reducing the external magnetic field can be obtained. In this case, it is possible to obtain the effect of reducing the external magnetic field while utilizing the existing design and manufacturing assets, and thus, it is possible to suppress costs.

4-2. Action and Effects

As described above, according to the fourth embodiment, the same effects as those of the first embodiment can be obtained. Further, the short-circuit winding 260 is provided in the predetermined layer 270 stacked on the wiring layer 240. As a result, since a reverse magnetic field is generated by the short-circuit winding 260, the external magnetic field intensity is reduced. As a result, it is possible to reliably reduce an error caused by the external magnetic field.

5. FIFTH EMBODIMENT

5-1. Overall Configuration Example of Storage Device

Figure 12:
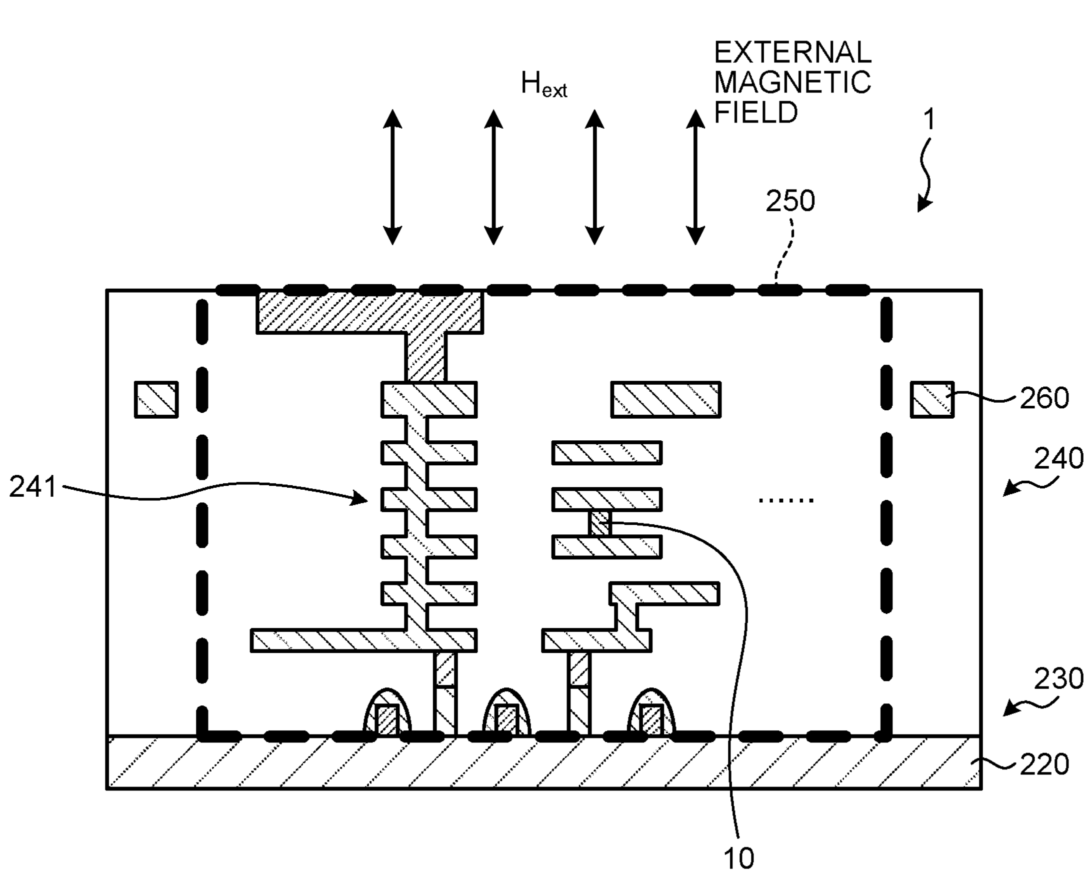
FIG. 12 is a cross-sectional view illustrating an example of an overall configuration of a storage device according to a fifth embodiment.

An overall configuration example of a storage device 1 according to a fifth embodiment will be described with reference to FIG. 12. FIG. 12 is a cross-sectional view illustrating an example of the overall configuration of the storage device 1 according to the fifth embodiment. Hereinafter, portions different from those of the first embodiment will be mainly described, and other descriptions will be omitted.

As illustrated in FIG. 12, an MTJ element 10 is provided in a wiring layer 240. In this case as well, an annular short-circuit winding 260 is provided in the vicinity of the MTJ element 10. As a result, the effect of reducing the external magnetic field can be obtained. For example, the short-circuit winding 260 may be provided in the same layer as a layer in which the MTJ element 10 is provided, or may be provided in a plurality of layers.

It is noted that the fifth embodiment can also be applied to other embodiments. Furthermore, in a case where the annular short-circuit winding 260 is provided in one layer, the effect of reducing the magnetic field can be obtained in any layer for the layer in which the short-circuit winding 260 is provided, but it is desirable that the annular short-circuit winding 260 is close to the MTJ element 10.

5-2. Action and Effects

As described above, according to the fifth embodiment, the same effects as those of the first embodiment can be obtained. In addition, a storage element (for example, the MTJ element 10) is provided in the wiring layer 240 including a wiring 241 connected to the storage element. In this case as well, since the reverse magnetic field is generated by the short-circuit winding 260, the external magnetic field intensity is reduced. As a result, it is possible to reliably reduce an error caused by the external magnetic field.

6. SIXTH EMBODIMENT

6-1. Overall Configuration Example of Storage Device

Figure 13:
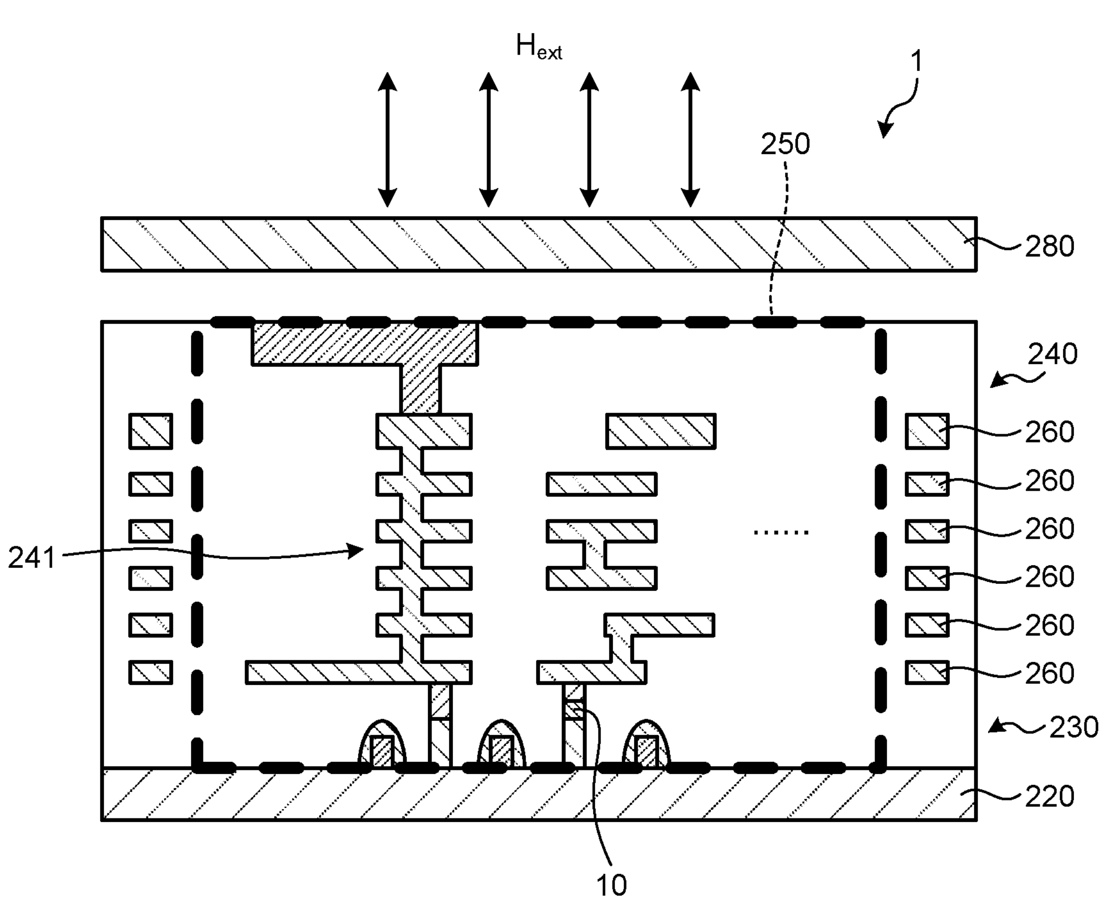
FIG. 13 is a cross-sectional view illustrating an example of an overall configuration of a storage device according to a sixth embodiment.

An overall configuration example of a storage device 1 according to a sixth embodiment will be described with reference to FIG. 13. FIG. 13 is a cross-sectional view illustrating an example of the overall configuration of the storage device 1 according to the sixth embodiment. Hereinafter, portions different from those of the second embodiment will be mainly described, and other descriptions will be omitted.

As illustrated in FIG. 13, a static magnetic field shielding member 280 is provided above a wiring layer 240 in addition to an annular short-circuit winding 260. The static magnetic field shielding member 280 is a member that shields a static magnetic field (static magnetic field). The static magnetic field shielding member is formed in, for example, a plate shape, and is provided so as to cover the wiring layer 240. As a material of the static magnetic field shielding member 280, for example, permalloy or the like is used. As a result, both the static magnetic field and the high-frequency magnetic field can be effectively reduced.

6-2. Action and Effects

As described above, according to the sixth embodiment, the same effects as those of the first and second embodiments can be obtained. In addition, the static magnetic field shielding member 280 is provided for the storage element (for example, the MTJ element 10) in addition to the short-circuit winding 260. As a result, the external magnetic field intensity is reduced by the static magnetic field shielding member 280 in addition to the reduction of the external magnetic field intensity by the short-circuit winding 260. As a result, it is possible to reliably reduce an error caused by the external magnetic field.

Further, the static magnetic field shielding member 280 may be provided so as to cover the wiring layer 240 including a wiring 241 connected to the storage element. As a result, the external magnetic field intensity can be reliably reduced by the static magnetic field shielding member 280. As a result, it is possible to more reliably reduce an error caused by the external magnetic field.

7. SEVENTH EMBODIMENT

7-1. Overall Configuration Example of Storage Device

Figure 14:
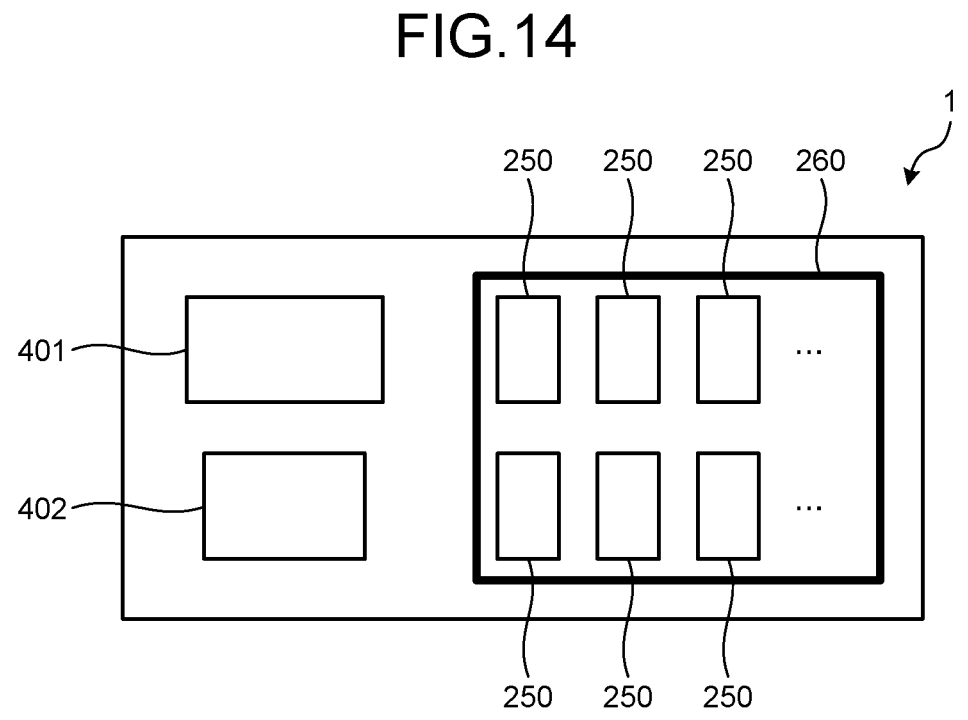
Figure 15:
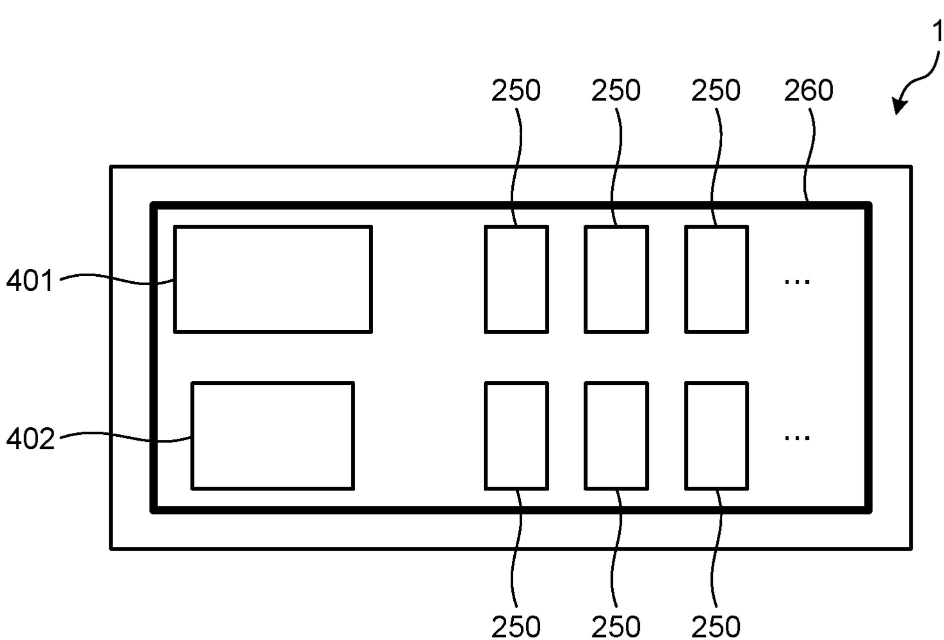
FIG. 15 is a cross-sectional view illustrating an example of an overall configuration of a modification of the storage device according to the seventh embodiment.

An overall configuration example of a storage device 1 according to a seventh embodiment will be described with reference to FIGS. 14 and 15. FIG. 14 is a cross-sectional view illustrating an example of the overall configuration of the storage device 1 according to the seventh embodiment. FIG. 15 is a cross-sectional view illustrating an example of an overall configuration of a modification of the storage device 1 according to the seventh embodiment. Hereinafter, portions different from those of the first embodiment will be mainly described, and other descriptions will be omitted.

As illustrated in FIG. 14, the storage device 1 includes a controller 401, a cache memory 402, and a plurality of memory units 250. The controller 401 controls each unit. The controller 401 stores, for example, data and commands that are frequently accessed in the cache memory 402. Examples of the storage device 1 include a solid state drive (SSD) and the like. It is noted that the controller 401 and the cache memory 402 correspond to a circuit unit including various circuits, various elements, and the like.

An annular short-circuit winding 260 is not provided for each memory unit 250 but is provided so as to be shared by the respective memory units 250. For example, the annular short-circuit winding 260 is provided so as to surround all the memory units 250. As a result, since a reverse magnetic field is generated by the short-circuit winding 260, the external magnetic field intensity is reduced.

As the annular short-circuit winding 260, the short-circuit winding 260 having the same configuration as that of the first to sixth embodiments can be used, but the annular short-circuit winding 260 is not provided for each memory unit 250 but is provided so as to be shared by the respective memory units 250.

Further, in the modification, as illustrated in FIG. 15, the annular short-circuit winding 260 is provided so as to be shared by the controller 401 and the cache memory 402 in addition to all the memory units 250. For example, the annular short-circuit winding 260 is provided so as to surround all of the controller 401, the cache memory 402, and each memory unit 250. As a result, since a reverse magnetic field is generated by the short-circuit winding 260, the external magnetic field intensity is reduced.

7-2. Action and Effects

As described above, according to the seventh embodiment, the same effects as those of the respective embodiments can be obtained. That is, the short-circuit winding 260 may be provided so as to be shared by a plurality of memory units 250 each including a plurality of storage elements (for example, the MTJ element 10). In this case as well, since the reverse magnetic field is generated by the short-circuit winding 260, the external magnetic field intensity can be reliably reduced. As a result, it is possible to reliably reduce an error caused by the external magnetic field.

The short-circuit winding 260 may be provided so as to be shared by the memory unit 250 and the circuit unit (for example, the controller 401, the cache memory 402, and the like). In this case as well, since the reverse magnetic field is generated by the short-circuit winding 260, the external magnetic field intensity can be reliably reduced. As a result, it is possible to reliably reduce an error caused by the external magnetic field.

8. OTHER EMBODIMENTS

The configurations according to the above embodiments may be implemented in various different forms other than the above embodiments. For example, the configurations are not limited to the above-described examples, and may be various modes. Furthermore, for example, the configuration, the processing procedure, the specific name, and the information including various data and parameters illustrated in the document or the drawings can be freely and selectively changed unless otherwise specified.

In addition, each component of each device illustrated in the drawings is functionally conceptual, and is not necessarily physically configured as illustrated in the drawings. That is, a specific form of distribution and integration of each device is not limited to the illustrated form, and all or a part thereof can be functionally or physically distributed and integrated in any unit according to various loads, usage conditions, and the like.

For example, each MTJ element 10 according to each of the above embodiments may be used as a magnetoresistive element, and a storage device such as a hard disk drive (HDD) may be configured as the storage device 1.

In each of the above embodiments, the STT-MRAM has been described as an example, but the present invention is not limited thereto, and the annular short-circuit winding 260 according to each of the embodiments can be applied to other devices having a magnetic body as a storage layer, for example, any type of MRAM such as a magnetic field writing type, a toggle type, a voltage reversal type, and a spin orbit torque type.

9. CONFIGURATION EXAMPLE OF ELECTRONIC DEVICE

As an electronic device including the storage device 1 according to each of the above-described embodiments (including each modification), an imaging device 300 and a game device 900 will be described with reference to FIGS. 16 to 18. For example, the imaging device 300 and the game device 900 use the storage device 1 according to each of the above-described embodiments as a memory. Examples of the memory include a flash memory and the like.

9-1. Imaging Device

The imaging device 300 including the storage device 1 according to any one of the above-described embodiments will be described with reference to FIG. 16. FIG. 16 is a diagram illustrating an example of a schematic configuration of the imaging device 300 including the storage device 1 according to any one of the above-described embodiments. Examples of the imaging device 300 include electronic devices such as a digital still camera, a video camera, a smartphone having an imaging function, and a mobile phone.

Figure 16:
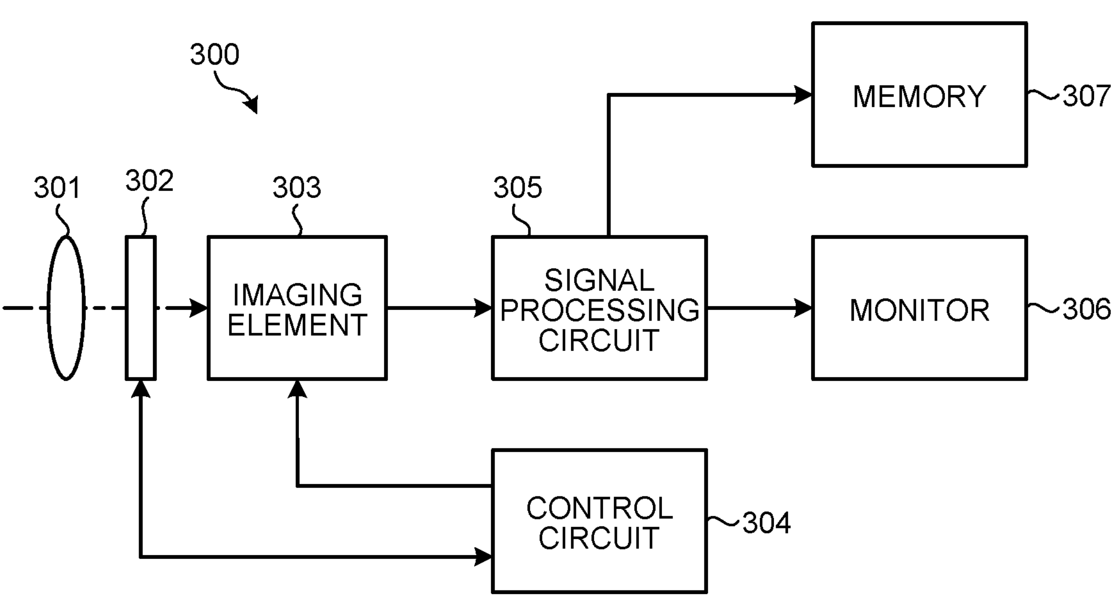
FIG. 16 is a diagram illustrating an example of a schematic configuration of an imaging device including the storage device according to any one of the embodiments.

As illustrated in FIG. 16, the imaging device 300 includes an optical system 301, a shutter device 302, an imaging element 303, a control circuit (drive circuit) 304, a signal processing circuit 305, a monitor 306, and a memory 307. The imaging device 300 can capture a still image and a moving image.

The optical system 301 includes one or a plurality of lenses. The optical system 301 guides light (incident light) from a subject to the imaging element 303 and forms an image on a light receiving surface of the imaging element 303.

The shutter device 302 is disposed between the optical system 301 and the imaging element 303. The shutter device 302 controls a light irradiation period and a light shielding period with respect to the imaging element 303 according to the control of the control circuit 304.

The imaging element 303 accumulates signal charges for a certain period according to light formed on the light receiving surface via the optical system 301 and the shutter device 302. The signal charges accumulated in the imaging element 303 is transferred in accordance with a drive signal (timing signal) supplied from the control circuit 304.

The control circuit 304 outputs the drive signal for controlling a transfer operation of the imaging element 303 and a shutter operation of the shutter device 302 to drive the imaging element 303 and the shutter device 302.

The signal processing circuit 305 performs various types of signal processing on the signal charges output from the imaging element 303. An image (image data) obtained by performing the signal processing by the signal processing circuit 305 is supplied to the monitor 306 and also supplied to the memory 307.

The monitor 306 displays a moving image or a still image captured by the imaging element 303 based on the image data supplied from the signal processing circuit 305. As the monitor 306, for example, a panel type display device such as a liquid crystal panel or an organic electro luminescence (EL) panel is used.

The memory 307 stores the image data supplied from the signal processing circuit 305, that is, image data of the moving image or the still image captured by the imaging element 303. The memory 307 includes the storage device 1 according to any one of the above-described embodiments.

Even in the imaging device 300 configured as described above, improvement in productivity can be realized by using the storage device 1 described above as the memory 307.

9-2. Game Device

The game device 900 including the storage device 1 according to any one of the above-described embodiments will be described with reference to FIGS. 17 and 18. FIG. 17 is a perspective view (external perspective view) illustrating an example of the schematic configuration of the game device 900 including the storage device 1 according to any one of the above-described embodiments. FIG. 18 is a block diagram illustrating an example of the schematic configuration of the game device 900.

Figure 17:
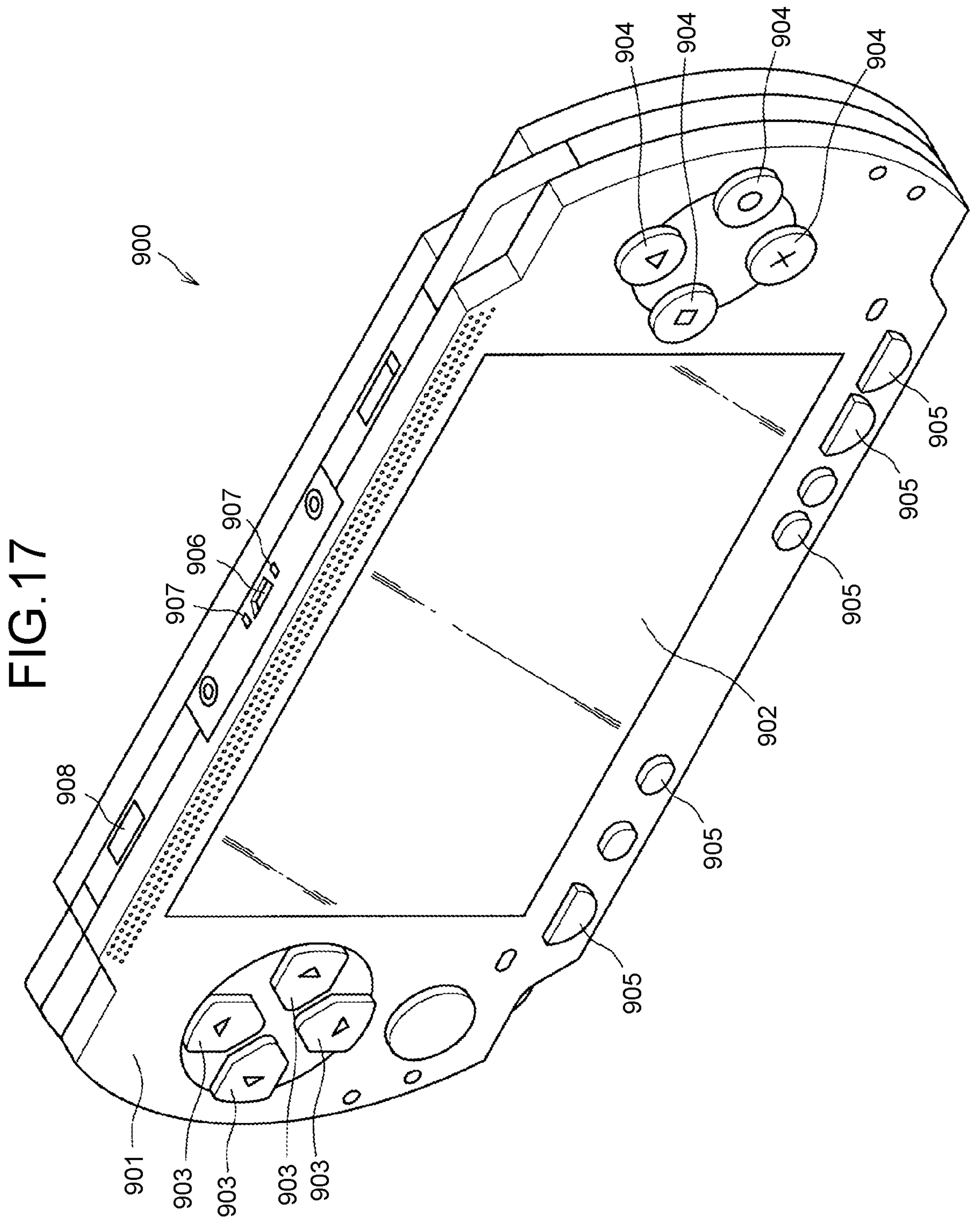
FIG. 17 is a perspective view illustrating an example of an appearance of a game device including the storage device according to any one of the embodiments.

As illustrated in FIG. 17, for example, the game device 900 has an appearance in which each component is disposed inside and outside an outer casing 901 formed in a horizontally long flat shape.

On the front surface of the outer casing 901, a display panel 902 is provided at the center thereof in the longitudinal direction. Further, operation keys 903 and operation keys 904 are provided on the left and right sides of the display panel 902, respectively, spaced apart from each other in the circumferential direction. An operation key 905 is provided at a lower end of the front surface of the outer casing 901. The operation keys 903, 904, and 905 function as direction keys, determination keys, or the like, and are used for selection of menu items displayed on the display panel 902, progress of a game, or the like.

On the upper surface of the outer casing 901, a connection terminal 906 for connecting an external device, a power supply terminal 907, a light receiving window 908 for performing infrared communication with the external device, and the like are provided.

Figure 18:
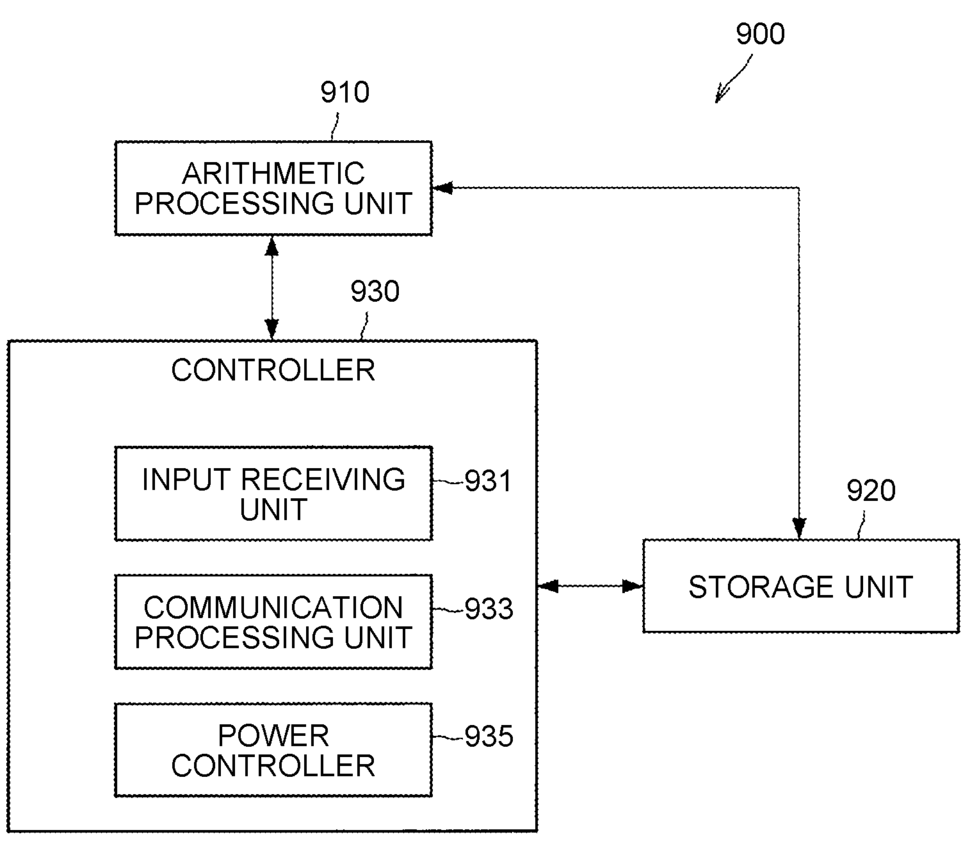
FIG. 18 is a block diagram illustrating an example of a schematic configuration of the game device in FIG. 16.

As illustrated in FIG. 18, the game device 900 includes an arithmetic processing unit 910 including a central processing unit (CPU), a storage unit 920 that stores various types of information, and a controller 930 that controls each configuration of the game device 900. Power is supplied to the arithmetic processing unit 910 and the controller 930 from, for example, a battery (not illustrated) or the like.

The arithmetic processing unit 910 generates a menu screen for allowing a user to set various types of information or select an application. In addition, the arithmetic processing unit 910 executes the application selected by the user.

The storage unit 920 stores various types of information set by the user. The storage unit 920 includes the storage device 1 according to any one of the above-described embodiments.

The controller 930 includes an input receiving unit 931, a communication processing unit 933, and a power controller 935. The input receiving unit 931 detects, for example, the states of the operation keys 903, 904, and 905. Furthermore, the communication processing unit 933 performs communication processing with an external device. The power controller 935 controls power supplied to each unit of the game device 900.

Even in the game device 900 configured as described above, improvement in productivity can be realized by using the storage device 1 described above as the storage unit 920.

It is noted that the storage device 1 according to each of the above-described embodiments may be mounted on the same semiconductor chip together with a semiconductor circuit forming an arithmetic device or the like to form a semiconductor device (System-on-a-Chip: SoC).

Furthermore, the storage device 1 according to each of the above-described embodiments can be mounted on various electronic devices on which a memory (storage unit) can be mounted as described above. For example, the storage device 1 may be mounted on various electronic devices such as a notebook personal computer (PC), a mobile device (for example, a smartphone, a tablet PC, or the like), a personal digital assistant (PDA), a wearable device, and a music device in addition to the imaging device 300 and the game device 900. For example, the storage device 1 is used as various memories such as a storage.

10. APPENDIX

It is noted that the present technology can also have the following configurations.

(1)

A storage device comprising:

a storage element including a storage layer having a changeable magnetization direction; and an annular short-circuit winding provided for the storage element and configured to have conductivity.

(2)

The storage device according to (1), wherein the short-circuit winding is provided near the storage element.

(3)

The storage device according to claim (1) or (2), further comprising a wiring layer including a wiring connected to the storage element, wherein the short-circuit winding is provided in the wiring layer.

(4)

The storage device according to (3), wherein the short-circuit winding is formed of the same material as the wiring.

(5)

The storage device according to (3), further comprising an element layer including the storage element, wherein the wiring layer is stacked on the element layer.

(6)

The storage device according to any one of (1) to (5), wherein the short-circuit winding is formed such that an inner region of a ring is positioned above or below the storage element.

(7)

The storage device according to any one of (1) to (5), wherein the short-circuit winding is formed so as to surround the storage element.

(8)

The storage device according to any one of (1) to (7), wherein a plurality of the storage elements are provided, and the short-circuit winding is provided for the plurality of storage elements.

(9)

The storage device according to any one of (1) to (8), wherein the short-circuit winding is a single winding, and a plurality of the short-circuit windings are provided.

(10)

The storage device according to (9), wherein the plurality of short-circuit windings are arranged in a height direction.

(11)

The storage device according to (9) or (10), wherein the plurality of short-circuit windings are connected to each other by a via.

(12)

The storage device according to any one of (9) to (11), wherein the plurality of short-circuit windings are provided in a concentric annular shape.

(13)

The storage device according to any one of (1) to (12), further comprising:

a wiring layer including a wiring connected to the storage element; and a predetermined layer stacked on the wiring layer, wherein the short-circuit winding is provided in the predetermined layer.

(14)

The storage device according to any one of (1) to (13), further comprising a wiring layer including a wiring connected to the storage element, wherein the storage element is provided in the wiring layer.

(15)

The storage device according to any one of (1) to (14), further comprising a static magnetic field shielding member provided for the storage element and configured to shield a static magnetic field.

(16)

The storage device according to (15), further comprising a wiring layer including a wiring connected to the storage element, wherein the static magnetic field shielding member is provided so as to cover the wiring layer.

(17)

The storage device according to any one of (1) to (16), further comprising a plurality of memory units, each of the memory units including a plurality of the storage elements, wherein the short-circuit winding is provided so as to be shared by the plurality of memory units.

(18)

The storage device according to any one of (1) to (16), further comprising:

a memory unit including a plurality of the storage elements; and a circuit unit other than the memory unit, wherein the short-circuit winding is provided so as to be shared by the memory unit and the circuit unit.

(19)

An electronic device comprising a storage device configured to store information, wherein the storage device includes:

a storage element including a storage layer having a changeable magnetization direction; and an annular short-circuit winding provided for the storage element and configured to have conductivity.

(20)

A method of manufacturing a storage device, the method comprising:

forming a storage element including a storage layer having a changeable magnetization direction; and forming an annular short-circuit winding for the storage element and configured to have conductivity.

(21)

An electronic device including the storage device according to any one of (1) to (18).

(22)

A method of manufacturing a storage device, the method manufacturing the storage device according to any one of (1) to (18).

REFERENCE SIGNS LIST

1 STORAGE DEVICE
10 MTJ ELEMENT
20 SELECTION TRANSISTOR
70 BIT LINE
72 GATE ELECTRODE
74 WIRING
100 BASE LAYER
102 FIXED LAYER
104 INSULATING LAYER
106 STORAGE LAYER
108 CAP LAYER
200 SEMICONDUCTOR SUBSTRATE
202 SOURCE REGION
204 DRAIN REGION
206 ELEMENT SEPARATION LAYER
208 CONTACT LAYER
210 CONTACT LAYER
220 SEMICONDUCTOR SUBSTRATE
230 ELEMENT LAYER
240 WIRING LAYER
241 WIRING
250 MEMORY UNIT
260 SHORT-CIRCUIT WINDING
270 PREDETERMINED LAYER
280 STATIC MAGNETIC FIELD SHIELDING MEMBER
300 IMAGING DEVICE
900 GAME DEVICE

The invention claimed is:

1. A storage device, comprising:

a storage element including a storage layer that has a changeable magnetization direction;

an annular short-circuit winding for the storage element, wherein the annular short-circuit winding is configured to have conductivity;

a wiring layer that includes a wiring, wherein the annular short-circuit winding includes a material same as the wiring of the wiring layer;

a memory unit; and a circuit unit, wherein the circuit unit includes a controller and a cache memory, the annular short-circuit winding is shared by the memory unit, the controller, and the cache memory, and the annular short-circuit winding surrounds the memory unit, the controller, and the cache memory.

2. The storage device according to claim 1, wherein the annular short-circuit winding is within a vicinity of the storage element.

3. The storage device according to claim 1, wherein the wiring is connected to the storage element, and the annular short-circuit winding is in the wiring layer.

4. The storage device according to claim 3, further comprising an element layer including the storage element, wherein the wiring layer is on the element layer.

5. The storage device according to claim 1, wherein the annular short-circuit winding is in a shape of a ring, and an inner region of the ring is one of above or below the storage element.

6. The storage device according to claim 1, wherein the annular short-circuit winding surrounds the storage element.

7. The storage device according to claim 1, further comprising a plurality of storage elements, wherein the plurality of storage elements includes the storage element, and the annular short-circuit winding is for the plurality of storage elements.

8. The storage device according to claim 1, wherein the annular short-circuit winding is a single winding, the storage device further comprising a plurality of annular short-circuit windings, and the plurality of annular short-circuit windings includes the annular short-circuit winding.

9. The storage device according to claim 8, wherein an arrangement of the plurality of annular short-circuit windings is in a height direction.

10. The storage device according to claim 8, wherein annular short-circuit windings in the plurality of annular short-circuit windings are connected by a via.

11. The storage device according to claim 8, wherein the plurality of annular short-circuit windings is in a concentric annular shape.

12. The storage device according to claim 1, further comprising:

a specific layer on the wiring layer, wherein the wiring is connected to the storage element, and the annular short-circuit winding is in the specific layer.

13. The storage device according to claim 1, wherein the wiring is connected to the storage element, and the storage element is in the wiring layer.

14. The storage device according to claim 1, further comprising a static magnetic field shielding member for the storage element, wherein the static magnetic field shielding member is configured to shield a static magnetic field.

15. The storage device according to claim 14, wherein the wiring is connected to the storage element, and the static magnetic field shielding member covers the wiring layer.

16. The storage device according to claim 1, further comprising a plurality of memory units, each of the plurality of memory units including a plurality of storage elements, wherein the plurality of storage elements includes the storage element, and the annular short-circuit winding is shared by the plurality of memory units.

17. The storage device according to claim 1, wherein the:

memory unit includes a plurality of storage elements including the storage element.

18. An electronic device, comprising:

a storage device configured to store information, wherein the storage device includes:

a storage element including a storage layer that has a changeable magnetization direction;

an annular short-circuit winding for the storage element, wherein the annular short-circuit winding is configured to have conductivity;

a wiring layer including a wiring, wherein the annular short-circuit winding includes a material same as the wiring of the wiring layer;

a memory unit; and a circuit unit, wherein the circuit unit includes a controller and a cache memory, the annular short-circuit winding is shared by the memory unit, the controller, and the cache memory, and the annular short-circuit winding surrounds the memory unit, the controller, and the cache memory.

19. A method of manufacturing a storage device, the method comprising:

forming a storage element including a storage layer that has a changeable magnetization direction;

forming an annular short-circuit winding for the storage element, wherein the annular short-circuit winding is configured to have conductivity;

forming a wiring layer which includes a wiring, wherein the annular short-circuit winding includes a material same as the wiring of the wiring layer;

forming a memory unit; and forming a circuit unit, wherein the circuit unit includes a controller and a cache memory, the annular short-circuit winding is shared by the memory unit, the controller, and the cache memory, and the annular short-circuit winding surrounds the memory unit, the controller, and the cache memory.

* * * * *